(12) United States Patent
Roesner et al.

(10) Patent No.: US 7,835,899 B2
(45) Date of Patent: Nov. 16, 2010

(54) SEQUENTIAL LOGIC IN SIMULATION INSTRUMENTATION OF AN ELECTRONIC SYSTEM

(75) Inventors: Wolfgang Roesner, Austin, TX (US); Derek E. Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 809 days.

(21) Appl. No.: 11/744,922

(22) Filed: May 7, 2007

(65) Prior Publication Data

US 2008/0281571 A1    Nov. 13, 2008

(51) Int. Cl.
*G06F 17/50* (2006.01)
*G06F 9/44* (2006.01)
*G06F 9/45* (2006.01)

(52) U.S. Cl. .................. 703/15; 717/135; 717/136; 716/3

(58) Field of Classification Search .............. 703/13, 703/14; 716/1, 4, 19; 717/135, 136, 140, 717/141
See application file for complete search history.

(56) References Cited

U.S. PATENT DOCUMENTS

2003/0131325 A1* 7/2003 Schubert et al. ............. 716/4
2003/0188299 A1* 10/2003 Broughton et al. .......... 717/141

* cited by examiner

*Primary Examiner*—Paul L Rodriguez
*Assistant Examiner*—Andre Pierre Louis
(74) *Attorney, Agent, or Firm*—Dillon & Yudell LLP

(57) ABSTRACT

According to a method of simulation processing, a collection of files including one or more HDL source files describing design entities collectively representing a digital design to be simulated is received. The HDL source file(s) include a statement specifying inclusion of an instrumentation entity not forming a portion of the digital design but enabling observation of its operation during simulation. The instrumentation entity includes sequential logic containing at least one storage element, where the instrumentation entity has an output signal indicative of occurrence of a simulation event. The collection of files is processed to obtain an instrumented simulation executable model. The processing includes instantiating at least one instance of each of the plurality of design entities and instantiating the instrumentation entity. The processing further includes instantiating external instrumentation logic, logically coupled to each instance of the instrumentation entity, to record occurrences of the event.

14 Claims, 20 Drawing Sheets

```
ENTITY FXUCHK IS

PORT(   S_IN        :   IN std_ulogic;
            Q_IN        :   IN std_ulogic;
            R_IN        :   IN std_ulogic;
            clock       :   IN std_ulogic;
            fails       :   OUT std_ulogic_vector(0 to 1);
            counts      :   OUT std_ulogic_vector(0 to 2);
        );
```

452 { --!! BEGIN
      --!! Design Entity: FXU;

453 { --!! Inputs
      --!! S_IN      =>   B.C.S;
      --!! Q_IN      =>   A.Q;
      --!! R_IN      =>   R;
      --!! CLOCK     =>   clock;
      --!! End Inputs 454 { --!! Fail Outputs;
      --!! 0 : "Fail message for failure event 0";
      --!! 1 : "Fail message for failure event 1";
      --!! End Fail Outputs;

455 { --!! Count Outputs;
      --!! 0 : <event0> clock;
      --!! 1 : <event1> clock;
      --!! 2 : <event2> clock;
      --!! End Count Outputs;

456 { --!! Harvest Outputs;
      --!! 0 : "Message for harvest event 0";
      --!! 1 : "Message for harvest event 1";
      --!! End Harvest Outputs;

457 { --!! End;

```
ARCHITECTURE example of FXUCHK IS

BEGIN

... HDL code for entity body section ...    } 458

END;
```

Fig. 4C

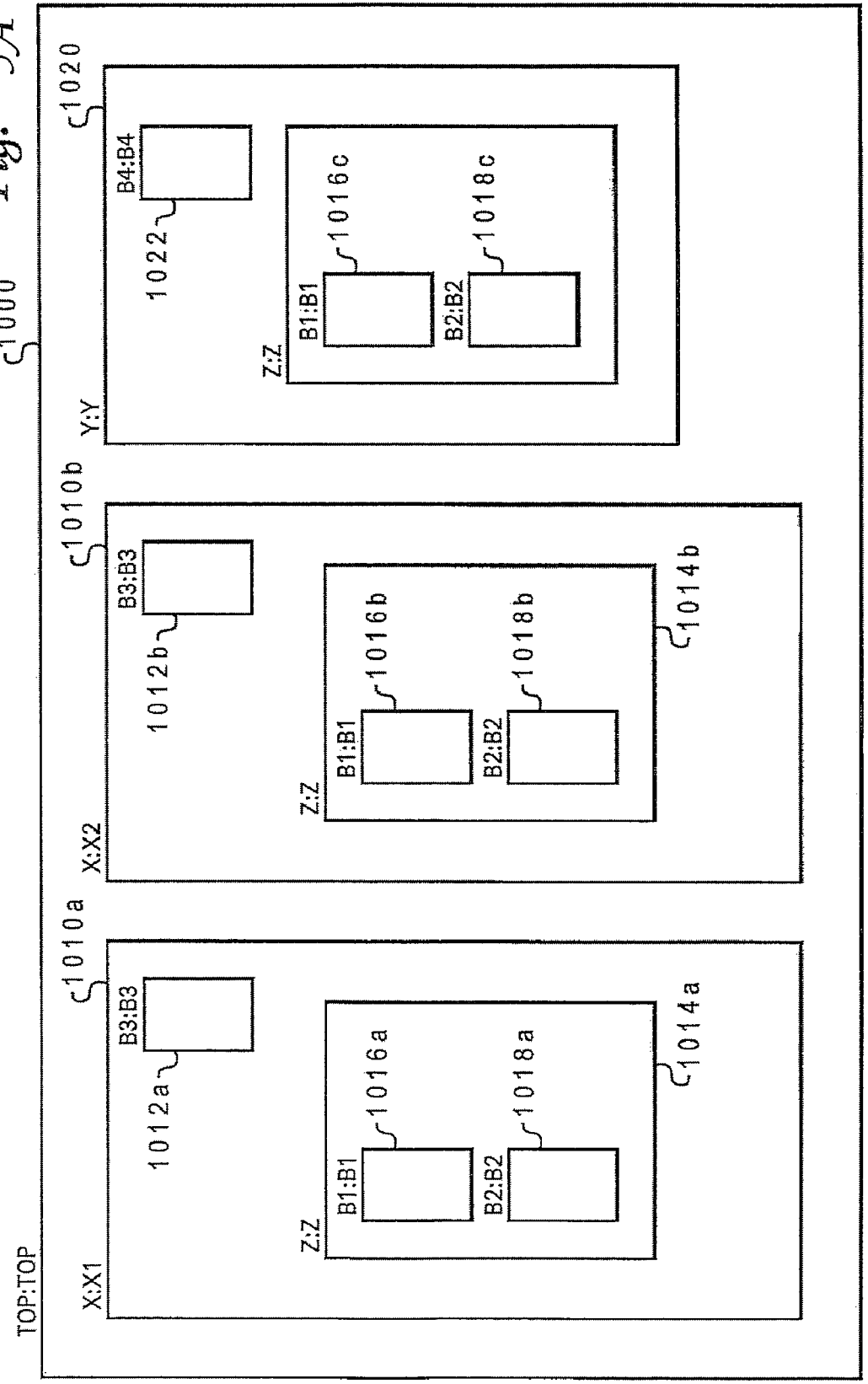

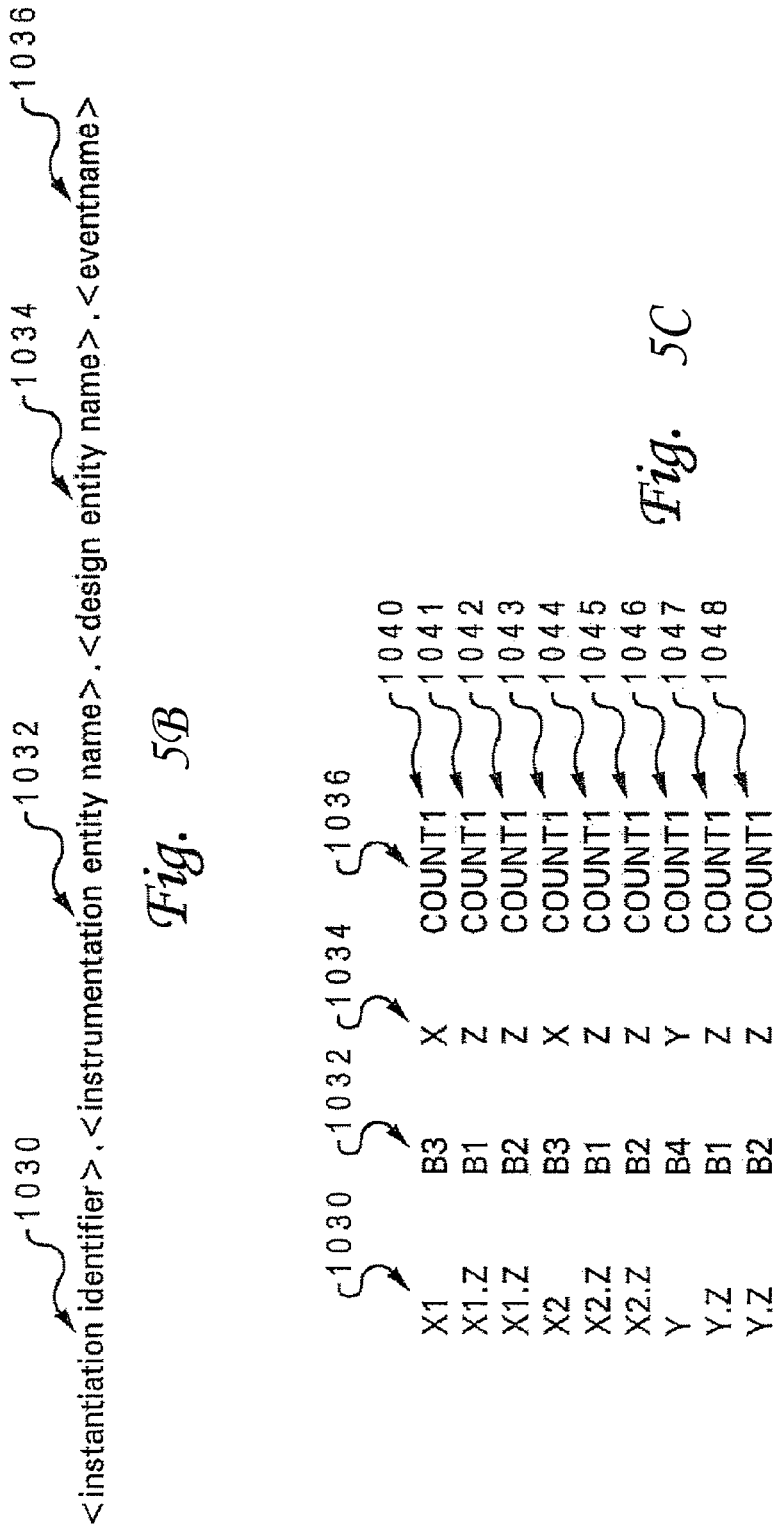

```
ENTITY X IS

PORT(  :
           :
           :
    );

ARCHITECTURE example of X IS

BEGIN
    .
    .
    .
    .
    ... HDL code for X ...
    .
    .
    .
    .

1221 {  Y:Y
        PORT MAP(  :
                   :
        );

1222 {  A <= ....
        B <= ....
        C <= ....
                                            1230
1223 {  --!! [count, countname0, clock] <= Y.P;   1232
        --!! Q <= Y. [B1.count.count1] AND A;    1234
        --!! [fail, failname0, "fail msg"] <= Q XOR B;
        --!! [harvest, harvestname0, "harvest msg"] <= B AND C;
        END;                                  1236
```
} 1220

Fig. 6B

SEQUENTIAL LOGIC IN SIMULATION INSTRUMENTATION OF AN ELECTRONIC SYSTEM

CROSS-REFERENCE TO RELATED APPLICATION

The present application is related to U.S. Pat. No. 7,039,574, which is incorporated herein by reference in its entirety.

BACKGROUND OF THE INVENTION

1. Technical Field

The present invention relates in general to designing and simulating electronic devices, modules and systems, and in particular, to a method and system for computer simulation of electronic devices, modules and systems utilizing a hardware description language (HDL) model. More particularly, the present invention relates to methods, systems, and program products supporting sequential logic in instrumentation of a simulation model.

2. Description of the Related Art

Verifying the logical correctness of a digital design and debugging the design, if necessary, are very important steps in most digital design processes. Logic networks are tested either by actually building networks or by simulating networks on a computer. As logic networks become highly complex, it becomes necessary to simulate a design before the design is actually built. This is especially true when the design is implemented as an integrated circuit, since the fabrication of integrated circuits requires considerable time and correction of mistakes is quite costly. The goal of digital design simulation is the verification of the logical correctness of the design.

In a typical automated design process that is supported by a conventional electronic computer-aided design (ECAD) system, a designer enters a high-level description utilizing a hardware description language (HDL), such as VHDL, producing a representation of the various circuit blocks and their interconnections. The ECAD system compiles the design description into a format that is best suited for simulation. A simulator is then utilized to verify the logical correctness of the design prior to developing a circuit layout.

A simulator is typically a software tool that operates on a digital representation, or simulation model of a circuit, and a list of input stimuli (i.e., testcase) representing inputs of the digital system. A simulator generates a numerical representation of the response of the circuit, which may then either be viewed on the display screen as a list of values or further interpreted, often by a separate software program, and presented on the display screen in graphical form. The simulator may be run either on a general-purpose computer or on another piece of electronic apparatus, typically attached to a general purpose computer, specially designed for simulation. Simulators that run entirely in software on a general-purpose computer will hereinafter be referred to as "software simulators". Simulators that are run with the assistance of specially designed electronic apparatus will hereinafter be referred to as "hardware simulators".

Usually, software simulators perform a very large number of calculations and operate slowly from the user's point of view. In order to optimize performance, the format of the simulation model is designed for very efficient use by the simulator. Hardware simulators, by nature, require that the simulation model comprising the circuit description be communicated in a specially designed format. In either case, a translation from an HDL description to a simulation format, hereinafter referred to as a simulation executable model, is required.

As described in the patent incorporated by reference above, designers are permitted to define and declare instrumentation logic that, while not forming apart of the simulated electronic system, nevertheless enables a designer to observe various data of interest regarding the internal states of the simulated electronic system at various times during its simulated operation. The instrumentation logic previous described is extended by the present invention.

SUMMARY OF THE INVENTION

According to a method of simulation processing, a collection of files including one or more HDL source files describing design entities collectively representing a digital design to be simulated is received. The HDL source file(s) include a statement specifying inclusion of an instrumentation entity not forming a portion of the digital design but enabling observation of its operation during simulation. The instrumentation entity includes sequential logic containing at least one storage element, where the instrumentation entity has an output signal indicative of occurrence of a simulation event. The collection of files is processed to obtain an instrumented simulation executable model. The processing includes instantiating at least one instance of each of the plurality of design entities and instantiating the instrumentation entity. The processing further includes instantiating external instrumentation logic, logically coupled to each instance of the instrumentation entity, to record occurrences of the event.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 4C illustrates exemplary sections of HDL syntax that maybe utilized in accordance with the present invention;

FIG. 5A is a block diagram illustrating a simulation model containing a number of design and instrumentation entities;

FIG. 5B depicts a data structure for declaring an event within a simulation model in accordance with one embodiment of the present invention;

FIG. 5C illustrates a list of extended event data structures for the simulation model in FIG. 5A;

FIG. 5D depicts a data structure for declaring an event within a simulation model in accordance with an alternate embodiment of the present invention;

FIG. 6B illustrates an exemplary HDL file for implementing instrumentation logic within an HDL design entity in accordance with the present invention;

DETAILED DESCRIPTION OF A PREFERRED EMBODIMENT

The present invention provides for accurate and comprehensive monitoring of a digital circuit design in which a designer creates instrumentation modules utilizing similar hardware description language (HDL) syntax as that utilized for the design itself. HDLs, while suited to the needs of digital designers can also be effectively utilized for a number of checking functions. In accordance with the method and system of the present invention, instrumentation modules are utilized to monitor specified design parameters while not becoming compiled as an integral part of the design itself. Furthermore, since the instrumentation modules can be specified utilizing an HDL similar to that utilized to describe the actual design, such modules are platform and simulator independent. Unlike checking performed with C or C++ programs, HDL instrumentation can be compiled and run directly without loss of performance on hardware simulators.

Figure 1:
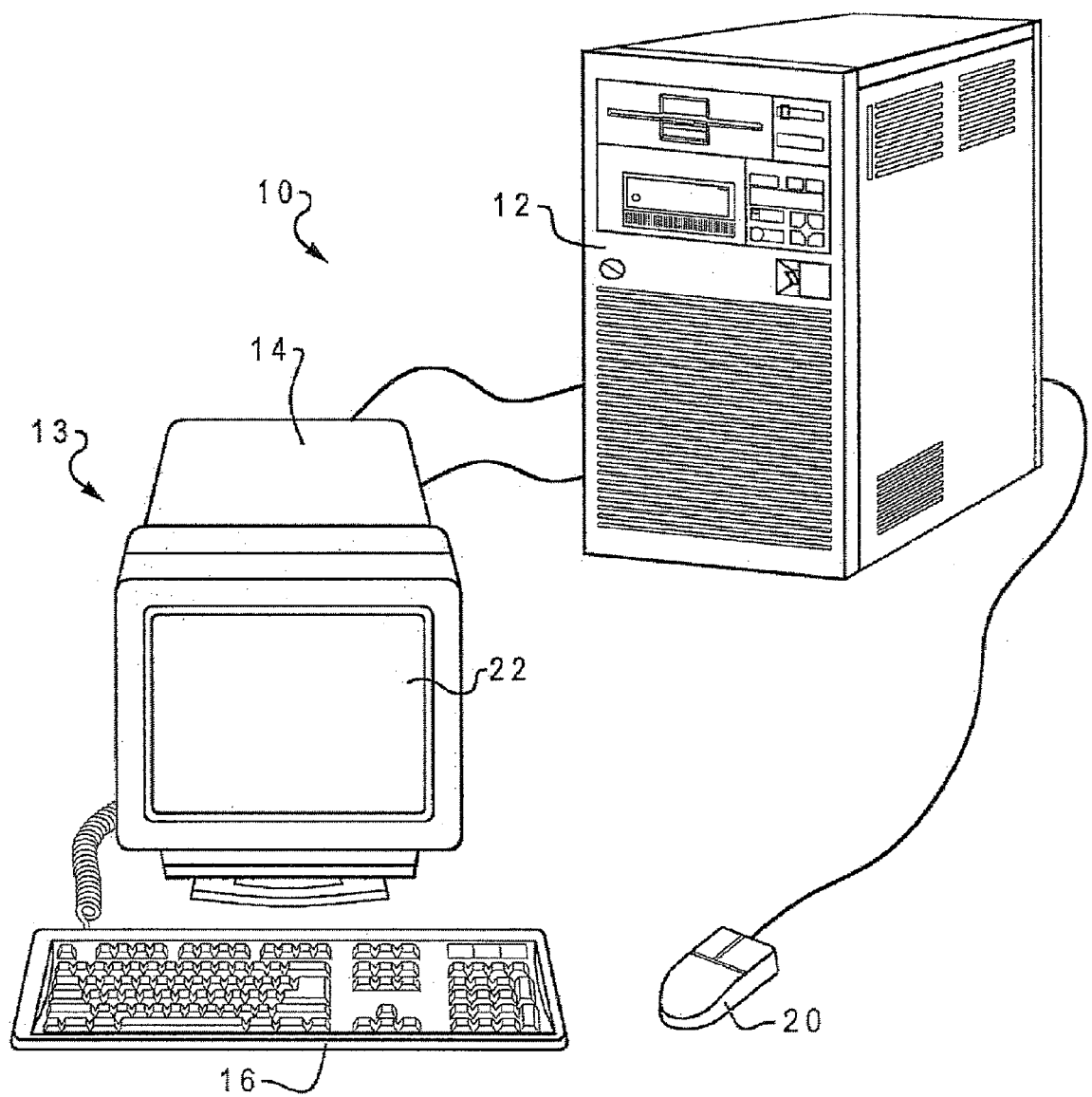
FIG. 1 is a pictorial representation of an exemplary data processing system.

With reference now to the figures, and in particular with reference to FIG. 1, there is depicted a pictorial representation of an exemplary data processing system 10 with which the present invention may be advantageously utilized. As illustrated, data processing system 10 comprises a server (or workstation) 12 to which one or more nodes 13 are connected. Server/workstation 12 preferably comprises a high performance multiprocessor computer, such as one of the POWER line of computer systems available from International Business Machines (IBM) Corporation of Armonk, N.Y. Server/workstation 12 preferably includes nonvolatile and volatile internal storage for storing software program code comprising an ECAD system, which can be utilized to develop and verify a digital circuit design in accordance with the present invention. As depicted, nodes 13 comprise at least a display device 14, a keyboard 16, and a mouse 20, and may further provide additional processing resources. The ECAD program code executed within workstation 12 preferably display a graphic user interface (GUI) within display screen 22 of display device 14 with which a digital circuit designer can interact using a keyboard 16 and mouse 20. Thus, by entering appropriate inputs utilizing keyboard 16 and mouse 20, the digital circuit designer is able to develop and verify a digital circuit design as described further hereinbelow.

Figure 2:
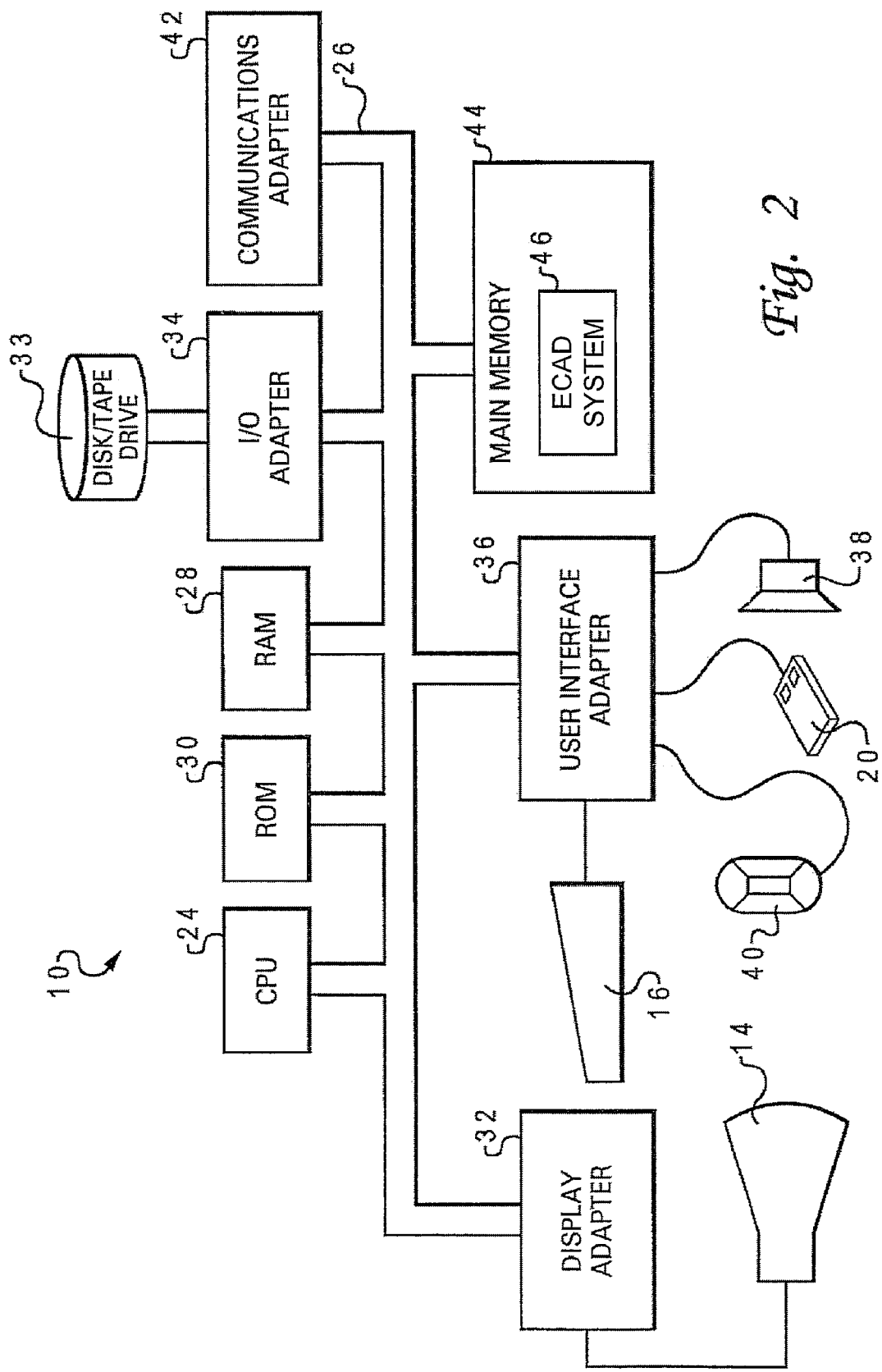
FIG. 2 depicts a representative hardware environment of the data processing system illustrated in FIG. 1.

FIG. 2 depicts a representative hardware environment of exemplary data processing system 10 of FIG. 1. Data processing system 10 is configured to include all functional hardware and software components of a computer system. Data processing system 10 includes one or more Central Processing Units (CPUs) 24, such as a conventional microprocessor, and a number of other components interconnected via system bus 26. CPU 24 controls the operation of the entire computer system, including performing the arithmetical and logical functions indicated by computer programs. Although not depicted in FIG. 2, CPUs such as CPU 24 typically include a control unit that organizes data and program storage in a computer memory and transfers the data and other information between the various parts of the computer system. Such CPUs also generally include an arithmetic unit that executes the arithmetical and logical operations, such as addition, comparison, multiplications and so forth. Such components and units of data processing system 10 can be implemented in server/workstation 12 of FIG. 1.

Data processing system 10 further includes a main (or system memory) 44, optional additional random-access memory (RAM) 28, read-only memory (ROM) 30, a display adapter 32 for connecting system bus 26 to display device 14 (e.g., a CRT or LCD flat-panel display), and an I/O adapter 34 for connecting peripheral devices (e.g., disk and tape drives 33) to system bus 26.

Data processing system 10 further includes user interface adapter 36 for connecting keyboard 16, mouse 20, speaker 38, microphone 40, and/or other user interface devices to system bus 26. A communications adapter 42 coupled to system bus 26 connects data processing system 10 to an external computer network (e.g., a local area network (LAN) or wide area network (WAN)).

Data processing system 10 also includes an operating system (e.g., Microsoft Windows, AIX or Linux) that resides within a machine-readable media to direct the operation of data processing system 10. Any suitable machine-readable media may retain the operating system, such as main memory 44, RAM 28, ROM 30, a magnetic disk, magnetic tape, or optical disk (the last three being located in disk and tape drives 33). A computer readable medium, such as main memory 44, further includes ECAD system 46 that, when processed by CPU 24, carries out the operations described herein.

Those skilled in the art will appreciate that the hardware depicted in FIG. 2 may vary for specific design and simulation applications. For example, other peripheral devices such as optical disk media, audio adapters, or chip programming devices, such as PAL or EPROM programming devices well-known in the art of computer hardware and the like, may be utilized in addition to or in place of the depicted hardware. In addition, although FIG. 2 only depicts a single CPU and a single system bus within data processing system 10, it should be understood that the present invention is not limited to the generalized system architecture shown in FIGS. 1 and 2 and that the present invention applies equally to computer systems that multiple CPUs and/or a more complex interconnect architecture.

Figure 3A:
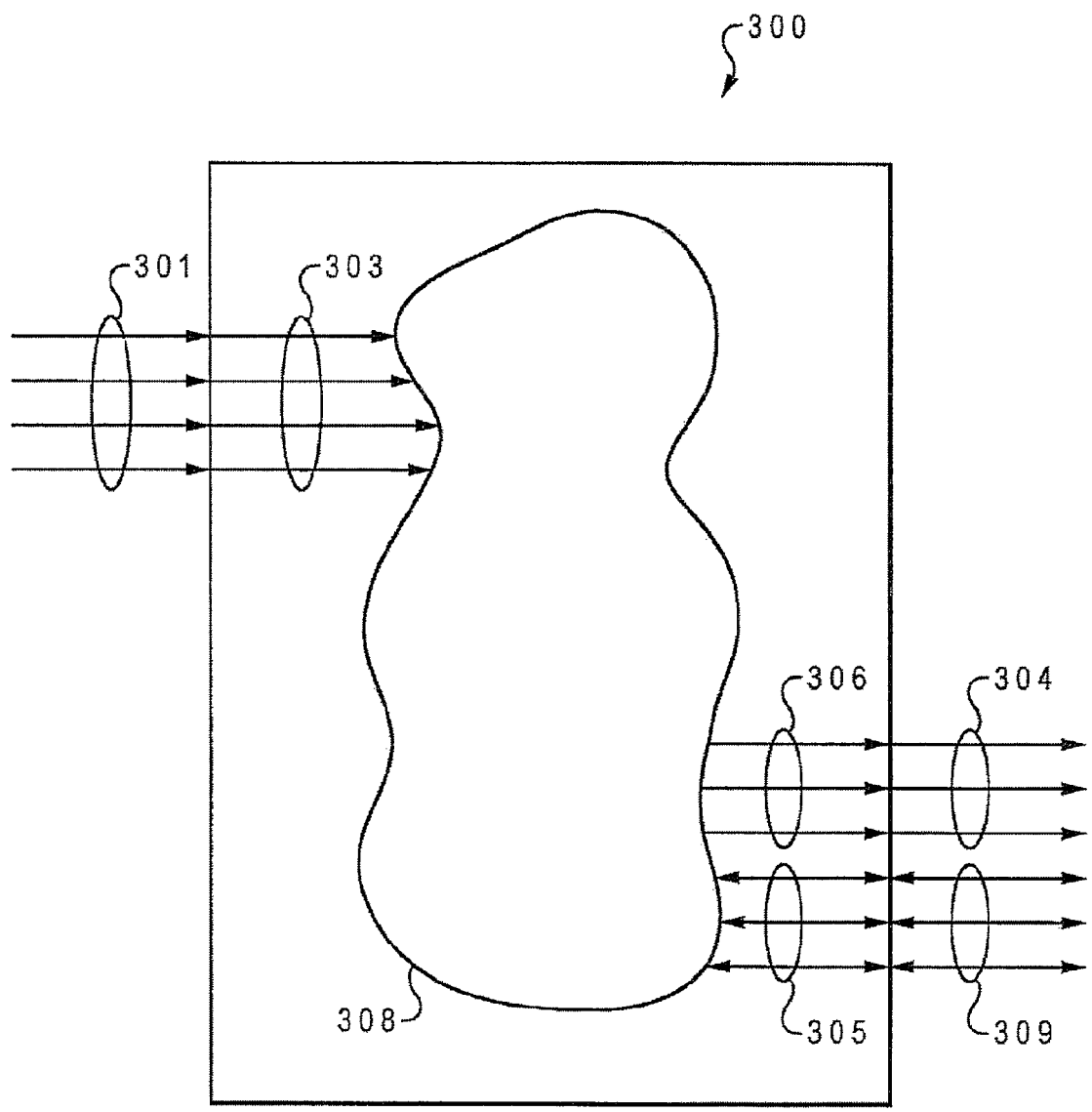
FIG. 3A is a simplified block diagram illustrating a digital design entity that may be instrumented in accordance with the present invention.

Simulated digital circuit design models are comprised of at least one and usually many sub-units referred to hereinafter as design entities. FIG. 3A is a block diagram representation of an exemplary design entity 300 in which the method and system of the present invention may be implemented. Design entity 300 is defined by a number of components: an entity name, entity ports, and a representation of the function performed by design entity 300. Each entity within a given model has a unique name (not explicitly shown in FIG. 3A) that is declared in the HDL description of each entity. Furthermore, each entity typically contains a number of signal interconnections, known as ports, to signals outside the entity. These outside signals may be primary input/outputs (I/Os) of an overall design or signals connecting to other entities within an overall design.

Typically, ports are categorized as belonging to one of three distinct types: input ports, output ports, and bi-directional ports. Design entity 300 is depicted as having a number of input ports 303 that convey signals into design entity 300. Input ports 303 are connected to input signals 301. In addition, design entity 300 includes a number of output ports 306 that convey signals out of design entity 300. Output ports 306 are connected to a set of output signals 304. Bi-directional ports 305 are utilized to convey signals into and out of design entity 300. Bi-directional ports 305 are in turn connected to a set of bi-directional signals 309. An entity, such as design entity 300, need not contain ports of all three types, and in the degenerate case, contains no ports at all. To accomplish the connection of entity ports to external signals, a mapping technique, known as a "port map", is utilized. A port map (not explicitly depicted in FIG. 3A) consists of a specified correspondence between entity port names and external signals to which the entity is connected. When building a simulation model, ECAD software is utilized to connect external signals to appropriate ports of the entity according to a port map specification.

Finally, design entity 300 contains a body section 308 that describes one or more functions performed by design entity 300. In the case of a digital design, body section 308 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Figure 3B:
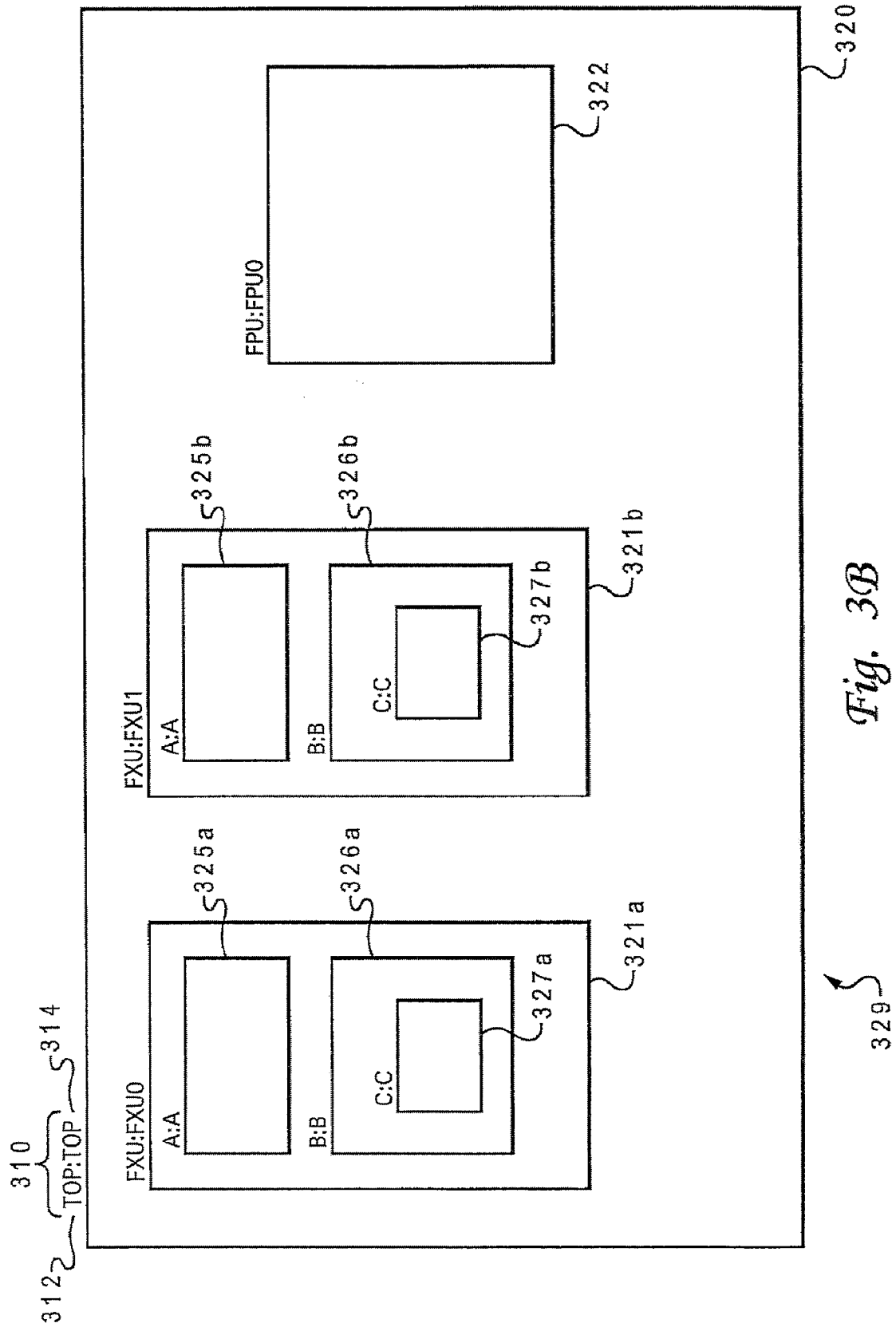
FIG. 3B is a diagrammatic representation depicting a simulation model that may be instrumented in accordance with the present invention.

Referring now to FIG. 3B, there is illustrated a diagrammatic representation of an exemplary simulation model 329 that may be utilized in a preferred embodiment of the present invention. Simulation model 329 consists of multiple hierarchical entities. For visual simplicity and clarity, the ports and signals interconnecting the entities within simulation model 329 have not been explicitly shown. In any model, one and only one entity is the so-called "top-level entity". A top-level entity 320 is that entity which encompasses all other entities within simulation model 329. That is to say, top-level entity 320 instantiates, either directly or indirectly, all descendant entities within a design. Simulation model 329 consists of top-level entity 320 which directly instantiates two instances, 321a and 321b, of an FXU entity 321 and a single instance of an FPU entity 322. Each instantiation has an associated description, which contains an entity name and a unique instantiation name. For top-level entity 320, description 310 is labeled "TOP:TOP". Description 310 includes an entity name 312, labeled as the "TOP" preceding the colon, and also includes an instantiation name 314, labeled as the "TOP" following the colon.

It is possible for a particular entity to be instantiated multiple times as is depicted with instantiations 321a and 321b of FXU entity 321. Instantiations 321a and 321b are distinct instantiations of FXU entity 321 with instantiation names FXU0 and FXU1 respectively. Top-level entity 320 is at the highest level within the hierarchy of simulation model 329. An entity that instantiates a descendant entity will be referred to hereinafter as an "ancestor" of the descendant entity. Top-level entity 320 is therefore the ancestor that directly instantiates FXU entity instantiations 321a and 321b. At any given level of a simulation model hierarchy, the instantiation names of all instantiations must be unique.

In addition to FXU entity instantiations 321a and 321b, top-level entity 320 directly instantiates a single instance of a FPU entity 322 having an entity name FPU and instantiation name FPU0. Within an entity description, it is common for the entity name to match the instantiation name when only one instance of that particular entity is placed at a given level of a simulation model hierarchy. However, this is not required as shown by entity 322 (instantiation name FPU0, entity name FPU).

Within instantiation 321a of FXU entity 321, single instance entities 325a and 326a of entity A 325 and entity B 326 respectively, are directly instantiated. Similarly, instantiation 321b of the same FXU entity contains instantiations 325b and 326b of entity A 325 and entity B 326 respectively. In a similar manner, instantiation 326a and instantiation 326b each directly instantiate a single instance of entity C 327 as entities 327a and 327b respectively. The nesting of entities within other entities can continue to an arbitrary level of complexity provided that all entities instantiated, whether singly or multiply, have unique entity names and the instantiation names at any given level of the hierarchy are unique with respect to one another. Each entity is constructed from one or more HDL files that contain the information necessary to describe the entity.

Associated with each entity instantiation is a so called "instantiation identifier". The instantiation identifier for a given instantiation is a string consisting of the enclosing entity instantiation names proceeding from the top-level entity instantiation name. For example, the instantiation identifier of instantiation 327a of entity C 327 within instantiation 321a of FXU entity 321 is "TOP.FXU0.B.C". This identifier serves to uniquely identify each instantiation within a simulation model.

Figure 3C:
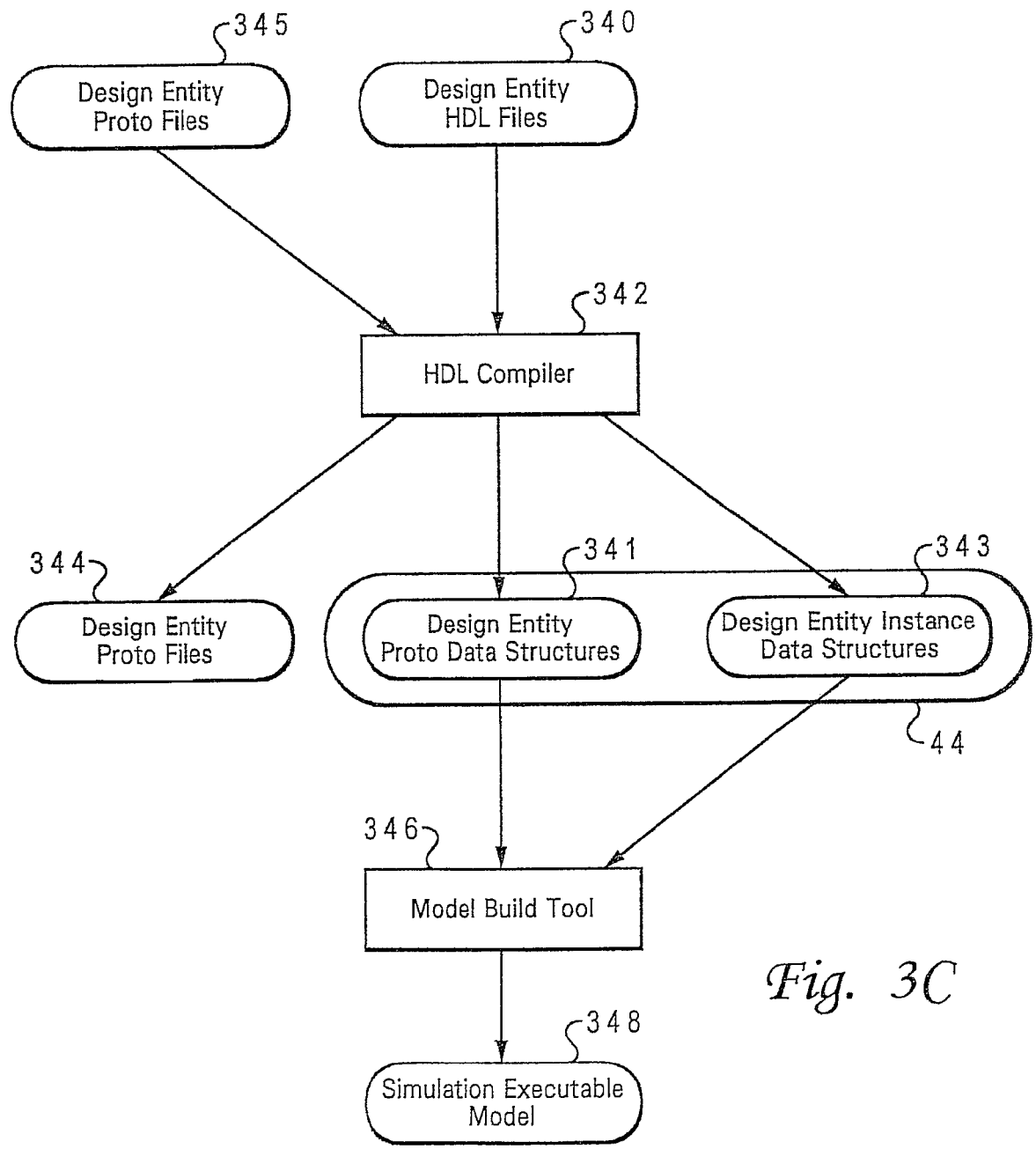
FIG. 3C is a flow diagram illustrating a model build process that may be implemented in accordance with the present invention.

Referring now to FIG. 3C, there is depicted a flow diagram of a model build process which may be implemented in a preferred embodiment of the present invention. The process begins with one or more design entity HDL source code files 340 and, potentially, one or more design entity intermediate format files 345, hereinafter referred to as "proto files" 345, available from a previous run of an HDL compiler 342. HDL compiler 342 processes HDL file(s) 340 beginning with the top level entity of a simulation model and proceeding in a recursive fashion through all HDL or proto file(s) describing a complete simulation model. For each of HDL files 340 during the compilation process, HDL compiler 342 examines proto files 345 to determine if a previously compiled proto file is available and consistent. If such a file is available and consistent, HDL compiler 342 will not recompile that particular file, but will rather refer to an extant proto file. If no such proto file is available or the proto file is not consistent, HDL compiler 342 explicitly recompiles the HDL file 340 in question and creates a proto file 344 for use in subsequent compilations. Such a process will be referred to hereinafter as "incremental compilation" and can greatly speed the process of creating a simulation executable model 348. Once created by HDL compiler 342, proto files 344 are available to serve as proto files 345 in subsequent compilations.

In addition to proto files 344, HDL compiler 342 also creates two sets of data structures, design entity proto data structures 341 and design entity instance data structures 343, in memory 44 of computer system 10. Design entity proto data structures 341 and design entity instance data structures 343, serve as a memory image of the contents of a simulation executable model 348. Data structures 341 and 343 are passed, via memory 44, to a model build tool 346 that processes data structures 341 and 343 into simulation executable model 348.

It will be assumed hereinafter that each entity is described by a single HDL file. Depending on convention or the particular HDL in which the current invention is practiced, this restriction may be required. However, in certain circumstances or for certain HDLs it is possible to describe an entity by utilizing more than one HDL file. Those skilled in the art will appreciate and understand the extensions necessary to practice the present invention if entities are permitted to be described by multiple HDL files. Furthermore, it will be assumed that there is a direct correspondence, for each entity, between the entity name and both of the following: the name of the HDL file representing the entity, and the name of the proto file for the entity.

In the following description, an HDL source code file corresponding to a given entity will be referred to by an entity name followed by ".vhdl". For example, the HDL source code file that describes top-level entity 320 will be referred to as TOP.vhdl. This labeling convention serves as a notational convenience only and should not be construed as limiting the applicability of the present invention to HDLs other than VHDL.

Returning to FIG. 3B, it can be seen that each entity may instantiate, either directly or indirectly, one or more other entities. For example, the FXU entity directly instantiates A entity 325 and B entity 326. Furthermore, B entity 326 directly instantiates C entity 327. Therefore, FXU entity 321 instantiates, directly or indirectly, A entity 325, B entity 326 and C entity 327. Those entities, that are directly or indirectly instantiated by another entity, will be referred to hereinafter as "descendants". The descendants of top level entity 320 are FXU entity 321, A entity 325, B entity 326, and C entity 327. It can be seen that each entity has a unique set of descendants and that each time an entity is instantiated, a unique instance of the entity and its descendants is created. Within simulation model 329, FXU entity 321 is instantiated twice, FXU:FXU0 321*a* and FXU:FXU1 321*b*, by top-level entity 320. Each instantiation of FXU entity 321 creates a unique set of instances of the FXU, A, B, and C entities.

For each entity, it is possible to define what is referred to as a "bill-of-materials" or BOM. A BOM is a list of HDL files having date and time stamps of the entity itself and the entity's descendants. Referring again to FIG. 3C, the BOM for an entity is stored in proto file 344 after compilation of the entity. Therefore, when HDL compiler 342 compiles a particular HDL source code file among HDL files 340, a proto file 344 is generated that includes a BOM listing the HDL files 340 that constitute the entity and the entity's descendants, if any. The BOM also contains the date and time stamp for each of the HDL files referenced as each appeared on disk/tape 33 of computer system 10 when the HDL file was being compiled.

If any of the HDL files constituting an entity or the entity's descendants is subsequently changed, proto file 344 will be flagged as inconsistent and HDL compiler 342 will recompile HDL file 340 on a subsequent re-compilation as will be described in further detail below. For example, going back to FIG. 3B, the HDL files referenced by the BOM of FXU entity 321 are FXU.vhdl, A.vhdl, B.vhdl and C.vhdl, each with appropriate date and time stamps. The files referenced by the BOM of top-level entity 320 are TOP.vhdl, FXU.vhdl, A.vhdl, B.vhdl, C.vhdl, and FPU.vhdl with appropriate date and time stamps.

Returning to FIG. 3C, HDL compiler 342 creates an image of the structure of a simulation model in main memory 44 of computer system 10. This memory image is comprised of the following components: "proto" data structures 341 and "instance" data structures 343. A proto is a data structure that, for each entity in the model, contains information about the ports of the entity, the body contents of the entity, and a list of references to other entities directly instantiated by the entity (in what follows, the term "proto" will be utilized to refer to the in-memory data structure described above and the term "proto file" will be utilized to describe intermediate format file(s) 344). Proto files 344 are therefore on-disk representations of the in-memory proto data structure produced by HDL compiler 342.

An instance data structure is a data structure that, for each instance of an entity within a model, contains the instance name for the instance, the name of the entity the instance refers to, and the port map information necessary to interconnect the entity with external signals. During compilation, each entity will have only one proto data structure, while, in the case of multiple instantiations of an entity, each entity may have one or more instance data structures.

In order to incrementally compile a model efficiently, HDL compiler 342 follows a recursive method of compilation in which successive entities of the model are considered and loaded from proto files 345 if such files are available and are consistent with the HDL source files constituting those entities and their descendants. For each entity that cannot be loaded from existing proto files 345, HDL compiler 342 recursively examines the descendants of the entity, loads those descendant entities available from proto file(s) 345 and creates, as needed, proto files 344 for those descendants that are inconsistent with proto files 345. Pseudocode for the main control loop of HDL compiler 342 is shown below (the line numbers to the right of the pseudocode are not a part of the pseudocode, but merely serve as a notational convenience).

```
process_HDL_file(file)                                          5
{                                                              10
    if (NOT proto_loaded(file) {                               15
        if (exists_proto_file(file) AND check_bom(file)) {     20
            load_proto(file);                                  25
        } else {                                               30
            parse_HDL_file(file)                               35
            for (all instances in file) {                      40
                process_HDL_file(instance);                    45
            }                                                  50
            create_proto(file);                                55
```

```
              write_proto_file(file);              60
         }                                         65
     }                                             70
     create_instance(file):                        75
}                                                  80
```

When compiler 342 is initially invoked, no proto data structures 341 or instance data structures 343 are present in memory 44 of computer system 10. The main control loop, routine process_HDL_file( ) (line 5), is invoked and passed the name of the top level entity by means of parameter "file". The algorithm first determines if a proto data structure for the current entity is present in memory 44 by means of routine proto_loaded( ) (line 15). Note that the proto data structure for the top level entity will never be present in memory because the process starts without any proto data structures loaded into memory 44. If a matching proto data structure is present in memory 44, instance data structures for the current entity and the current entity's descendants, if any, are created as necessary in memory 44 by routine create_instance( ) (line 75).

However, if a matching proto data structure is not present in memory 44, control passes to line 20 where routine exists_proto_file( ) examines proto files 345 to determine if a proto file exists for the entity. If and only if a matching proto file exists, routine check_bom( ) is called to determine whether proto file 345 is consistent. In order to determine whether the proto file is consistent, the BOM for the proto file is examined. Routine check_bom( ) examines each HDL source code file listed in the BOM to determine if the date or time stamps for the HDL source code file have changed or if the HDL source code file has been deleted. If either condition occurs for any file in the BOM, the proto file is inconsistent and routine check_bom( ) fails. However, if check_bom( ) is successful, control is passed to line 25 where routine load_proto( ) loads the proto file and any descendant proto files into memory 44, thus creating proto data structures 341 for the current entity and the current entity's descendants, if any. The construction of process_HDL_file( ) ensures that once a proto file has been verified as consistent, all of its descendant proto files, if any, are also consistent.

If the proto file is either non-existent or is not consistent, control passes to line 35where routine parse_HDL_file( ) loads the HDL source code file for the current entity. Routine parse_HDL_file( ) (line 35) examines the HDL source code file for syntactic correctness and determines which descendant entities, if any, are instantiated by the current entity. Lines 40, 45, and 50 constitute a loop in which the routine process_HDL_file( ) is recursively called to process the descendent entities that are called by the current entity. This process repeats recursively traversing all the descendants of the current entity in a depth-first fashion creating proto data structures 341 and proto data files 344 of all descendants of the current entity. Once the descendant entities are processed, control passes to line 55 where a new proto data structure is created for the current entity in memory 44 by routine create_proto( ). Control then passes to line 60where a new proto file 344, including an associated BOM, is written to disk 33 by routine write_proto_file( ). Finally, control passes to line 75 where routine create_instance( ) creates instance data structures 343 for the current entity and any descendant entities as necessary. In this manner, process_HDL_file( ) (line 5) recursively processes the entire simulation model creating an in-memory image of the model consisting of proto data structures 341 and instance data structures 343.

Figure 3D:
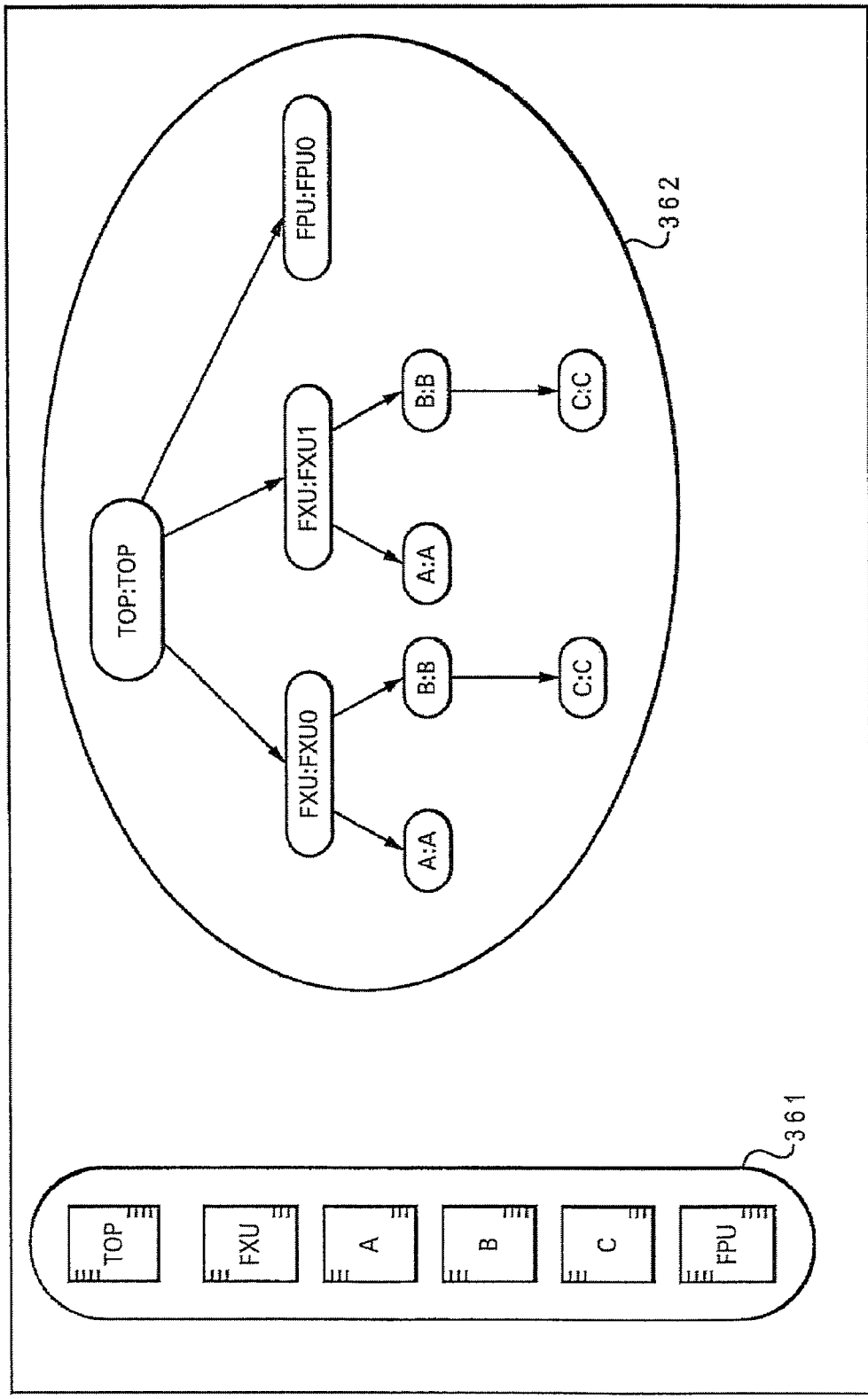
FIG. 3D is a block diagram depicting data structures that may be instrumented in accordance with the present invention.

With reference now to FIG. 3D there is depicted a block diagram representing compiled data structures, which may be implemented in a preferred embodiment of the present invention. Memory 44 contains proto data structures 361, one for each of the entities referred to in simulation model 329. In addition, instantiations in simulation model 329 are represented by instance data structures 362. Instance data structures 362 are connected by means of pointers indicating the hierarchical nature of the instantiations of the entities within simulation model 329. Model build tool 346 in FIG. 3C processes the contents of memory 44 into memory data structures in order to produce simulation executable model 348.

In order to instrument simulation models, the present invention makes use of entities known as "instrumentation entities," which are in contrast to the entities constituting a design which are referred to herein as "design entities". As with design entities, instrumentation entities are described by one or more HDL source code files and consist of a number of signal ports, a body section, and an entity name. In what follows, it will be assumed that an instrumentation entity is described by a single HDL file. Those skilled in the art will appreciate and understand extensions necessary to practice the current invention for an instrumentation entity that is described by multiple HDL files. Each instrumentation entity is associated with a specific design entity referred to hereinafter as the "target entity".

Figure 4A:
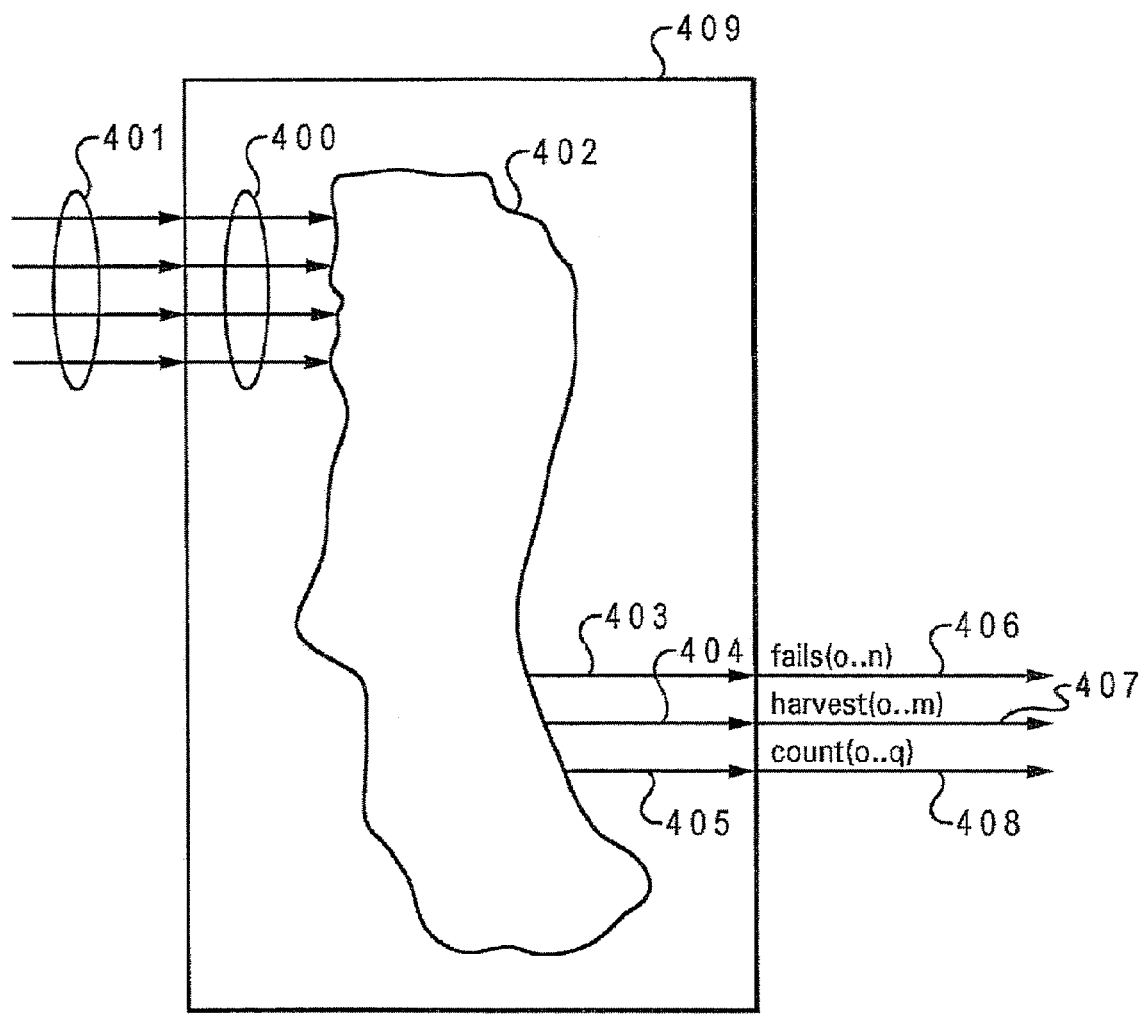
FIG. 4A is a simplified block diagram representative of an instrumentation entity.

With reference now to FIG. 4A, there is illustrated a block diagram representation of an instrumentation entity 409. Instrumentation entity 409 includes a number of input ports 400 that are connected to signals 401 within a target entity (not depicted in FIG. 4A). A body section 402 contains logic necessary to detect occurrences of specified conditions within the target entity and generate simulation model "events" with respect to signals 401. At least three distinct types of events may be generated: "count" events, "fail" events, and "harvest" events, each described below in turn. Body section 402 contains internal logic for detecting occurrences of conditions precipitating generation of these events. A set of multi-bit output ports 403, 404, and 405 are connected to external instrumentation logic 420 (depicted in FIG. 4B) by means of external signals 406, 407, and 408. Output ports 403, 404, and 405 thus provide the connection from the internal logic in body section 402 to the external instrumentation logic 420, which is utilized to indicate the occurrence of count, failure, and harvest events.

A failure event is a sequence of signal values that indicate a failure in the correct operation of the simulation model. Each instrumentation entity monitors the target entity for any desired number of failure events. Each occurrence of a failure event is assigned to a particular signal bit on output port 403. Logic within body section 402 produces an active high pulse on a specified bit of signal 403 when a failure condition is detected. Such activation of signal 403 is defined as a failure event. This error indication is conveyed by means of external signal 406 to external instrumentation logic (depicted in FIG. 4B as external instrumentation logic block 420), which flags the occurrence of the failure event.

A count event is a sequence of signal values that indicate the occurrence of an event within a simulation model for which it would be advantageous to maintain a count. Count events are utilized to monitor the frequency of occurrence of specific sequences within a simulation model. Each instrumentation entity can monitor the target entity for any desired number of count events. Each count event is assigned to a particular signal bit on output port 405. Logic block 402 contains the logic necessary to detect the occurrence of the desired count events and produces an active high pulse on the specified bit of signal 405 when a count event is detected. This count indication is conveyed by means of external signal 408 to instrumentation logic, which contains counters utilized to record the number of occurrences of each count event.

The third event type, a harvest event, is a sequence of signal values that indicate the occurrence of a specific operative circumstance, which would be advantageous to be able to reproduce. When a harvest event occurs, a register within an external instrumentation logic block is loaded to indicate at what point within a simulation run the event occurred, and a flag is set to indicate the occurrence of the specific circumstance. The details of the simulation run can thus be saved in order to recreate the specific circumstance monitored by the harvest event. Logic block 402 contains the logic necessary to detect the harvest events.

Each instrumentation entity can detect any desired number of harvest events that are each assigned to a particular signal bit on output port 404. Logic within block 402 produces an active high pulse on the specified bit of signal 404 when a harvest event is detected. This harvest event detection is conveyed by means of external signal 407 to external instrumentation logic that contains a register and flag for each harvest event. The register is utilized to record at which point in the simulation run the harvest event occurred, and the flag is utilized to indicate the occurrence.

Figure 4B:
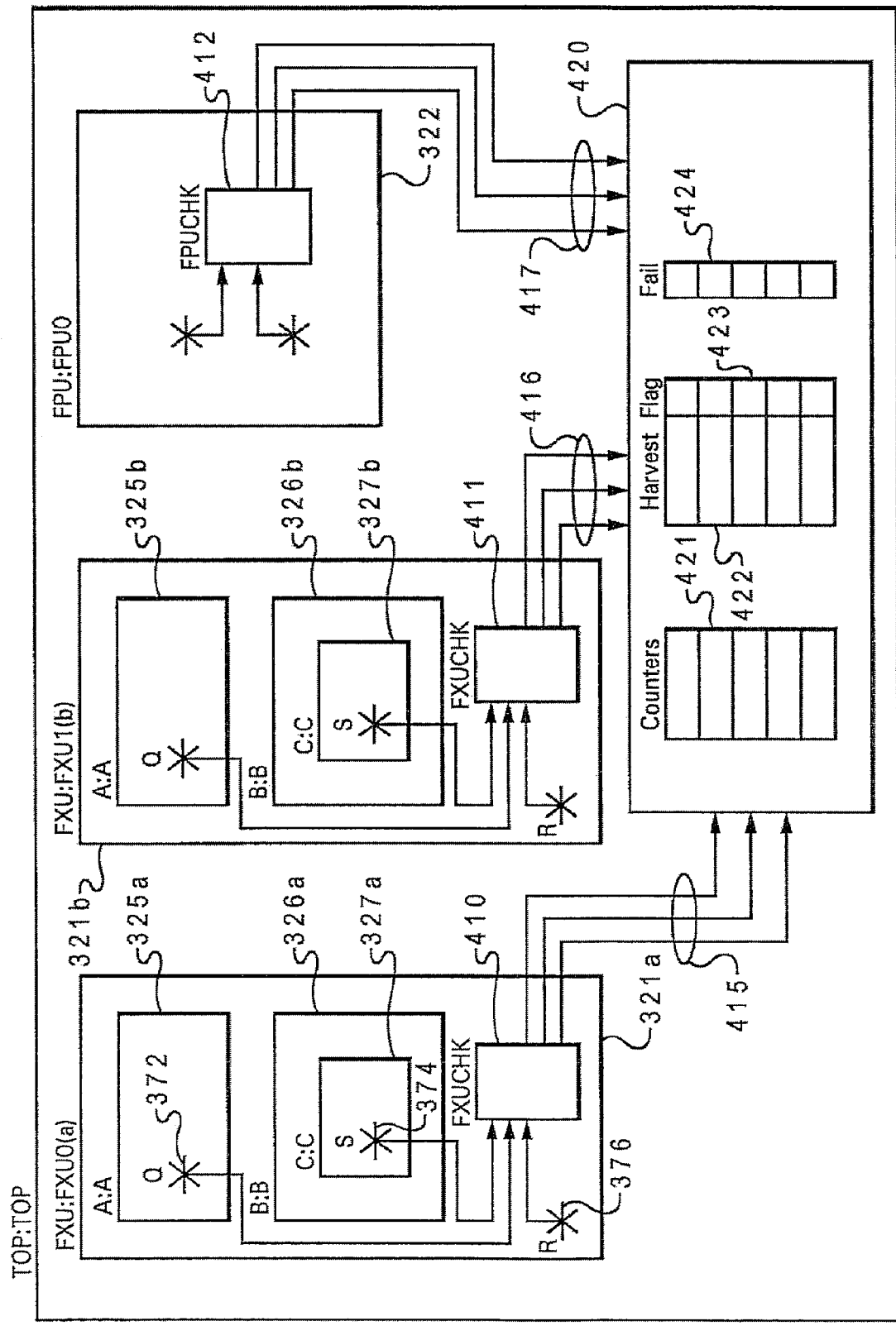
FIG. 4B is a simplified block diagram of a simulation model instrumented in accordance with the present invention.

With reference now to FIG. 4B, there is depicted a block diagram representation of simulation model 329 instrumented in accordance with the teachings of the present invention. As can be seen in FIG. 4B, an instance 410 and an instance 411 of an instrumentation entity FXUCHK are utilized to monitor instances 321*a* and 321*b* of an FXU entity. For each FXU instantiations of 321*a* and 321*b*, an FXUCHK instantiation, 410 and 411 respectively, is automatically generated by the mechanism of the present invention. In a similar fashion, instrumentation entity FPUCHK 412 is instantiated to monitor FPU entity 322.

As depicted in FIG. 4B, entity FXUCHK monitors a signal Q 372, a signal R 376, and a signal S 374 within each of instances 321*a* and 321*b* of the FXU entity. Signal Q 372, is a signal within the instances 325*a* and 325*b* of descendant entity A. Likewise, signal S 374 is a signal within descendant entity C that resides within descendant entity B. Finally, signal R 376 occurs directly within FXU entity 321. Although an instrumentation entity may monitor any signal within a target entity or the target entity's descendent entities, signals outside the target entity cannot be monitored.

Each instrumentation entity is connected by means of fail, count, and harvest signals to instrumentation logic block 420 containing logic for recording occurrences of each of the event types. For the count events monitored in simulation model 329, a set of counters 421 is utilized to count the number of occurrences of each count event. In a similar manner, a set of flags 424 is utilized to record the occurrence of failure events. In addition, a set of counters 422 and flags 423 are combined and utilized to record the point at which a harvest event occurs and its occurrence, respectively. In one embodiment of the present invention, a cycle number is captured and stored utilizing counters 422 and flags 423 to record a harvest event.

To facilitate instantiation and connection of instrumentation entities, instrumentation entity HDL source code files include a specialized comment section, hereinafter referred to as "instrumentation entity description", that indicates the target entity, the signals within the target entity to be monitored, and information specifying types of events to be monitored.

With reference now to FIG. 4C, there is illustrated an exemplary instrumentation HDL source code file 440 that describes instrumentation entity FXUCHK depicted in FIG. 4B. HDL file 440 utilizes the syntax of the VHDL hardware description language. In the VHDL language, lines beginning with two dashes ("--") are recognized by a compiler as being comments. The method and system of the present invention utilize comments of a non-conventional form to indicate information about an instrumentation entity. FIG. 4C depicts one embodiment of the present invention in which comments include two exclamation points following the initial dashes in order to distinguish these comments from conventional comments in instrumentation HDL file 440. It will be appreciated by those skilled in the art that the exemplary syntax utilized in FIG. 4C for the provision of unconventional comments is but one of many possible formats.

Within HDL file 440, the I/O ports of a FXUCHK entity are declared in entity declaration 450. Within entity declaration 450, three input ports, S_IN, Q_IN, and R_IN, respectively, are declared. Input ports, S_IN, Q_IN, and R_IN, will be attached to signal S, 374, signal Q, 372, and signal R, 376 respectively as described below. Input port, CLOCK, is also declared and will be connected to a signal, CLOCK, within the FXU entity. In addition, three output ports: fails (0 to 1), counts(0 to 2), and harvests(0 to 1), are declared. These output ports provide failure, count, and harvest signals for two failure events, three count events, and two harvest events. The names of the output ports are fixed by convention in order to provide an efficient means for automatically connecting these signals to instrumentation logic block 420.

A set of instrumentation entity descriptors 451 is utilized to provide information about the instrumentation entity. As illustrated in FIG. 4C, descriptor comments 451 may be categorized in a number of distinct sections: prologue and entity name declaration 452, an input port map 453, a set of failure message declarations 454, a set of counter declarations 455, a set of harvest event declarations 456, and an epilogue 457.

The prologue and entity name 452 serve to indicate the name of the particular target entity that the instrumentation entity will monitor. Prologue and entity name declaration 452 also serves as an indication that the instrumentation entity description has begun. Specifically, the comment "--!! Begin" within prologue and entity name 452, indicates that the description of an instrumentation entity has begun. The comment "--!! Design Entity: FXU" identifies the target entity which, in HDL file 440, is design entity FXU. This declaration serves to bind the instrumentation entity to the target entity.

Input port map 453 serves as a connection between the input ports of an instrumentation entity and the signals to be monitored within the target entity. The comments begin with comment "--!! Inputs" and end with comment "--!! End Inputs". Between these comments, comments of the form "--!! inst_ent_port_name=>trgt_ent_signal_name" are utilized, one for each input port of the instrumentation entity, to indicate connections between the instrumentation entity ports and the target entity signals. The inst_ent_port_name is the name of the instrumentation entity port to be connected to the target entity signal. The trgt_ent_signal_name is the name of the signal within the target entity that will be connected to the instrumentation entity port.

In some cases a signal to be monitored lies within a descendant of a target entity. This is the case for signal S 374, which is embedded within entity C which is a descendant of entity B 326 and target FXU entity 321. Input port map 453 includes an identification string for signal S 374, which consists of the instance names of the entities within the target entity each separated by periods ("."). This identification string is prepended to the signal name. The signal mapping comment within input port map 453 for signal S 374 is therefore as follows:

--!! S_IN=>B.C.S;

This syntax allows an instrumentation entity to connect to any signal within the target entity or the target entity's descendant entities. A signal appearing on the top level of the target design entity, has no pre-pended entity names; and therefore, has the following signal mapping comment:

--!! R_IN=>R;

For signals on the top level of the target entity, a special connection method is provided. If the signal to be connected to has the same name as its corresponding signal in the port map of the instrumentation entity, no input port mapping comment is required and the signal will be automatically connected if no such comment is present. In other words, if the input port mapping comment is of the form:

--!! signal=>signal;

where signal is a legal signal name without periods ("."), then the input port mapping comment is not required and the system of the present invention will automatically make the connect. It is also possible to provide comments of the form given above to explicitly denote the signal connection. This mechanism is only operative for signals on the top level of the target entity.

Failure message declarations 454 begin with a comment of the form "--!! Fail Outputs;", and end with a comment of the form "--!! End Fail Outputs;". Each failure event output is associated with a unique event name and a failure message. This message may be output by the simulation run-time environment upon detecting a failure event. The unique failure event name is utilized to identify the specific failure event within the model. Each failure event signal may be declared by a comment of the form "--!! n: <eventname> "failure message";" where n is an integer denoting the failure event to which the message is associated, <eventname> is the unique failure event name, and "failure message" is the message associated with the particular failure event. One and only one failure message declaration comment must be provided for each failure event monitored by the instrumentation entity.

Counter declaration comments 455 begin with a comment of the form "--!! Count Outputs;" and end with a comment of the form "--!! End Count Outputs;". Each count event output is associated with a unique variable name. This name is associated with a counter in counter logic 421 FIG. 4B. The variable name provides a means to identify and reference the particular counter associated with a particular count event. Thus, a comment of the form "--!! n: <varname> qualifying_signal [+/−];" is associated with each counter event output. Within this convention, n is an integer denoting which counter event in the instrumentation module is to be associated with a variable name "varname," and qualifying_signal is the name of a signal within a target design entity utilized to determine when to sample the count event pulse, as will be further described hereinbelow. The parameter "qualifying_signal" is followed by A+/−A to specify whether the qualifying signal will be a high active qualifying signal or a low active qualifying signal.

Harvest declarations 456 begin with a prologue comment of the form "--!! Harvest Outputs;" and end with a comment of the form "--!! End Harvest Outputs;". Each harvest event output is associated with a unique event name and a message that may be output by the simulation runtime environment when a harvest event has occurred during a simulation run. Each harvest event signal is declared in the form "--!! n: <eventname> "harvest message";" where n is an integer denoting which harvest event the message is to be associated with, <eventname> is the unique harvest event name and "harvest message" is the message to be associated with the particular harvest event.

Harvest messages and event names, fail messages and event names, and counter variable names for a simulation model, are included in a simulation executable model, and lists of all the events within the model are produced in separate files at model build time. In this manner, each simulation model includes the information for each event monitored, and a separate file containing this information for each event is available. Furthermore, as will be described below, the model build process names each event within the model (count, fail, and harvest) in such a manner as to insure that each event has a unique name with certain useful properties.

Finally, epilogue comment 457 consists of a single comment of the form "--!! End;", indicating the end of descriptor comments 451. The remainder of instrumentation entity HDL file 440 that follows the I/O declarations described above is an entity body section 458. In entity body section 458, conventional HDL syntax is utilized to define internal instrumentation logic necessary to detect the various events on the input port signals and convey these events to the output port signals.

In addition to descriptor comments 451, that are located in the HDL source code file for an instrumentation entity, an additional comment line is required in the target entity HDL file. A comment of the form "--!! Instrumentation: name.vhdl", where name.vhdl is the name of the instrumentation entity HDL file, is added to the target entity HDL source code file. This comment provides a linkage between the instrumentation entity and its target entity. It is possible to have more than one such comment in a target entity when more than one instrumentation entity is associated with the target entity. These HDL file comments will hereinafter be referred to as "instrumentation entity instantiations".

Figure 4D:
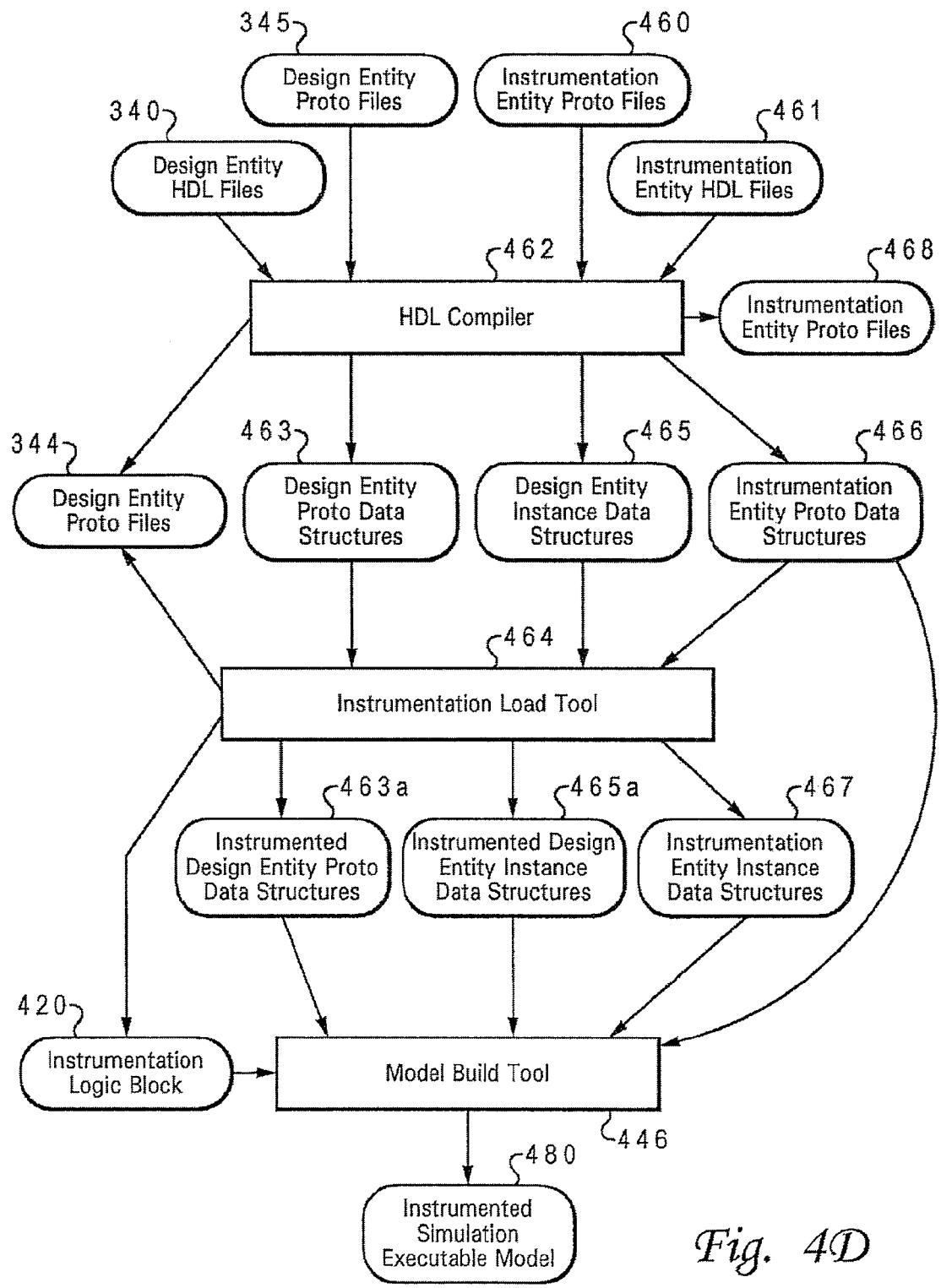
FIG. 4D is a flow diagram depicting a model build process in accordance with the present invention.

With reference now to FIG. 4D, there is depicted a model build process in accordance with the teachings of the present invention. In this model build process, instrumentation load tool 464 is utilized to alter the in-memory proto and instance data structures of a simulation model thereby adding instrumentation entities to the simulation model. Instrumentation load tool 464 utilizes descriptor comments 451 within instrumentation HDL files 461 to create instance data structures for the instrumentation entities within a simulation model.

The model build process of FIG. 4D begins with design entity HDL files 340 and, potentially, one or more design entity proto files 345 (available from a previous run of HDL compiler 462), instrumentation entity HDL files 460, and potentially, one or more instrumentation entity proto files 461 (available from a previous run of HDL compiler 462). HDL compiler 462, processes design entity HDL files 340, and instrumentation entity HDL files 460 following an augmentation of algorithm process_HDL_file( ) that provides for efficient incremental compilation of the design and instrumentation entities comprising a simulation model. HDL compiler 462 loads proto data structures from design entity proto files 345 and instrumentation entity proto files 460, if such proto files are available and consistent. If such proto files are not available or are not consistent, HDL compiler 462 compiles design entity HDL files 340 and instrumentation entity HDL files 460 in order to produce design entity proto files 344 and instrumentation entity proto files 468. (Design entity proto files 344 and instrumentation entity proto files 468 are available to serve as design entity proto files 345 and instrumentation entity proto files 460 respectively for a subsequent run of HDL compiler 462.)

In addition, HDL compiler 462 creates in-memory design proto data structures 463 and design instance data structures 465 for the design entities of a simulation model. HDL compiler 462 also creates in-memory instrumentation proto data structures 466 for the instrumentation entities of a simulation model.

In order to minimize processing overhead HDL compiler 462 neither reads nor processes descriptor comments 451. However, HDL compiler 462 does recognize instrumentation entity instantiation comments within target entity HDL files. As such, HDL compiler 462 cannot create instance data structures instrumentation entity data structures 467. The creation of instance data structures requires interconnection information contained within descriptor comments 451 not processed by HDL compiler 462. HDL compiler 462 does, however, create instrumentation proto data structures 466.

The in-memory design proto data structures 463, design instance data structures 465, and instrumentation entity proto data structures 466, are processed by instrumentation load tool 464. Instrumentation load tool 464 examines design entity proto data structures 463 and design entity instance data structures 465 to determine those design entities that are target entities. This examination is accomplished by utilizing a particular comment format as previously described.

All target entities that are loaded from design entity proto files 345 contain an instantiation for any associated instrumentation entity. Therefore, instrumentation load tool 464 merely creates an instance data structure 467 for any such instrumentation entity and passes, the unaltered design proto data structure 463 to instrumented design proto data structure 463a, and passes design instance data structure 465 to instrumented design instance data structure 465a.

If however, a target entity is loaded from design entity HDL files 340, rather than from design entity proto files 345, instrumentation load tool 464 must alter its design proto data structure 463 and its design instance data structure 465 to instantiate an associated instrumentation entity. An instrumented design proto data structure 463a and instrumented design instance data structure 465a are thereby produced. In addition, instrumentation load tool 464 creates an instrumentation instance data structure 467 for each instrumentation entity associated with the current design entity.

The design entity proto data structures 463 that are altered by instrumentation load tool 464 are saved to disk 33 of computer system 10 as design entity proto files 344. Design entity proto files 344, which may include references to instrumentation entities, are directly loaded by a subsequent compilation of a simulation model, thus saving processing by instrumentation load tool 464 on subsequent recompilations unless an alteration is made to a design entity or an associated instrumentation entity.

In order for HDL compiler 462 to determine if alterations were made to either a target design entity or the target design entity's associated instrumentation entities, the BOM of a target design entity is expanded to include the HDL files constituting the instrumentation entities. In this manner, HDL compiler 462 can determine, by inspection of the BOM for a given design entity, whether to recompile the design entity and the design entity's associated instrumentation entities or load these structures from proto files 345 and 461.

Finally, instrumentation load tool 464 creates a unique proto and instance data structure for instrumentation logic block 420 and connects the fail, harvest, and count event signals from each instrumentation entity instantiation to instrumentation logic block 420. Model build tool 446 processes in-memory proto and instance data structures 463a, 465a, 467, 466 to produce instrumented simulation executable model 480.

In HDL compiler 462, algorithm process_HDL_file( ) is augmented to allow for the incremental compilation of design and instrumentation entities. A pseudocode implementation of a main control loop of HDL compiler 462 is shown below:

```
process_HDL_file2(file,design_flag)                        5
{                                                         10
    if (NOT proto_loaded(file)) {                         15
        if (exists_proto_file(file) AND check_bom(file)) { 20
            load_proto(file);                             25
    } else {                                              30
        parse_HDL_file(file)                              35
        for (all instances in file) {                     40
            process_HDL_file2(instance, design_flag);     45
        }                                                 50
        if (design_flag=TRUE) {                           55
            for (all instrumentation instances in file){  60
                process_HDL_file2(instance, FALSE);       65
            }                                             70
        }                                                 75
        create_proto(file);                               80
        write_proto_file(file);                           90
    }                                                     95
}                                                        100
if (design_flag=TRUE) {                                  105
    create_instance(file);                               110
}                                                        115
}                                                        120
```

Algorithm process_HDL_file2( ) is an augmentation to process_HDL_file( ) of HDL compiler 342 in order to support the creation of instrumented simulation models. The algorithm is invoked with the name of the top level design entity passed through parameter file and a flag indicating whether the entity being processed is a design entity or an instrumentation entity passed through parameter design_flag (design_flag=TRUE for design entities and FALSE for instrumentation entities). Algorithm process_HDL_file2( ) (line 5) first checks, by means of routine proto_loaded( ) (line 15), if the proto for the current entity is already present in memory 44. If so, processing passes to line 105. Otherwise, control is passed to line 20 and 25 where disk 33 of computer system 10 is examined to determine if proto files for the entity and its descendants (including instrumentation entities, if any) exist and are consistent. If so, the appropriate proto files are loaded from disk 10 by routine load_proto( ) (line 25) creating proto data structures, as necessary, in memory 44 for the current entity and the current entity's descendants including instrumentation entities.

If the proto file is unavailable or inconsistent, control passes to line 35 where the current entity HDL file is parsed. For any entities instantiated within the current entity, lines 40 to 55 recursively call process_HDL_file2( ) (line 5) in order to process these descendants of the current entity. Control then passes to line 55 where the design_flag parameter is examined to determine if the current entity being processed is a design entity or an instrumentation entity. If the current entity is an instrumentation entity, control passes to line 80. Otherwise, the current entity is a design entity and lines 60 to 70 recursively call process_HDL_file2( ) (line 5) to process any instrumentation entities instantiated by means of instrumentation instantiation comments. It should be noted that algorithm process_HDL_file2( ) (line 5) does not allow for instrumentation entities to monitor instrumentation entities. Any instrumentation entity instantiation comments within an instrumentation entity are ignored. Control then passes to line 80 where proto data structures are created in memory 44 as needed for the current entity and any instrumentation entities. Control then passes to line 90 where the newly created proto data structures are written, as needed to disk 33 of computer system 10.

Control finally passes to line 105 and 110 where, if the current entity is a design entity, instance data structures are created as needed for the current entity and the current entity's descendants. If the current entity is an instrumentation entity, routine create_instance( ) (line 110) is not called. Instrumentation load tool 464 is utilized to create the in-memory instance data structures for instrumentation entities.

It will be apparent to those skilled in the art that HDL compiler 462 provides for an efficient incremental compilation of design and instrumentation entities. It should also be noted that the above description is but one of many possible means for accomplishing an incremental compilation of instrumentation entities. In particular, although many other options also exist, much, if not all, of the functionality of instrumentation load tool 464 can be merged into HDL compiler 462.

Figure 4E:
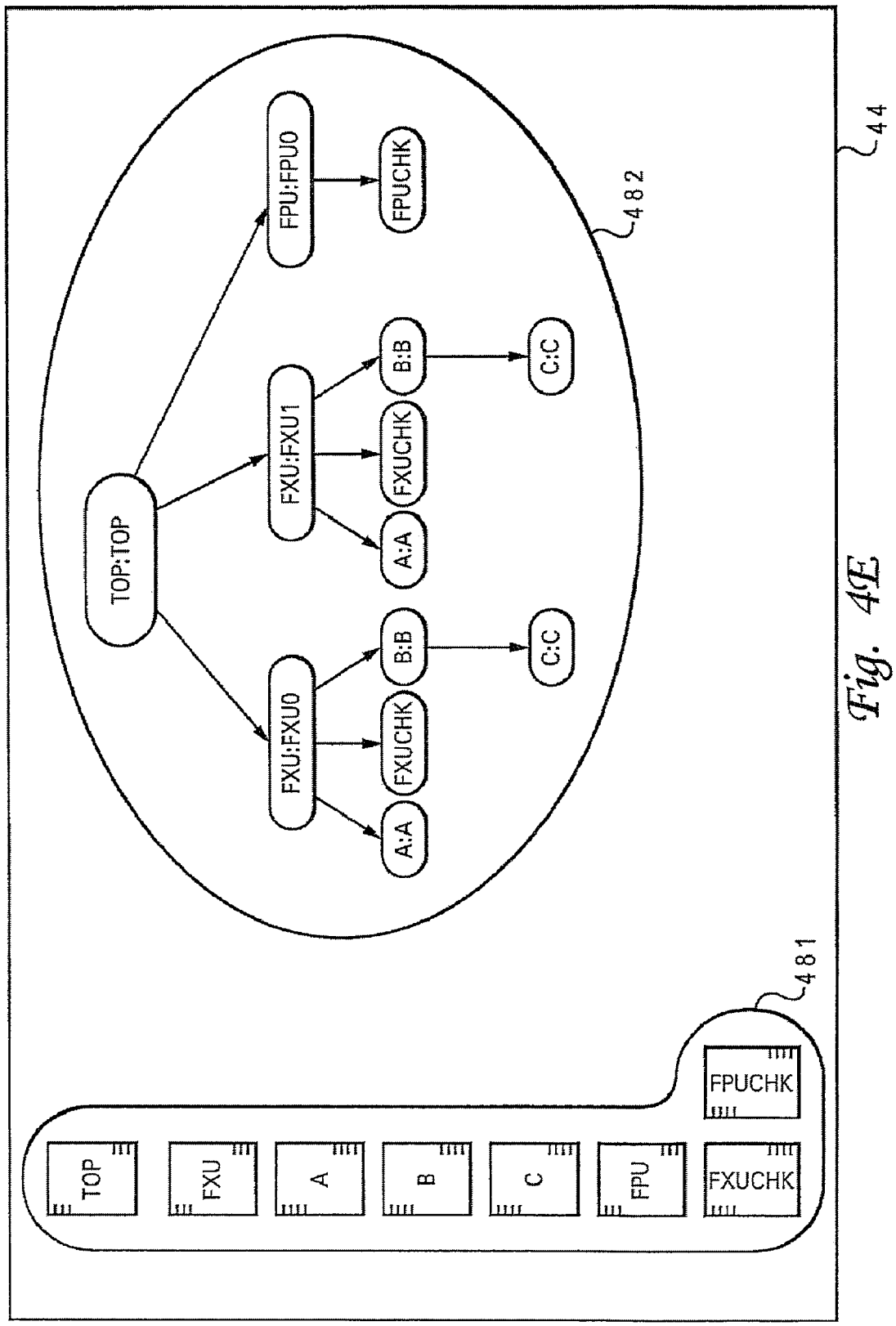
FIG. 4E is a block diagram representation of memory data structures constructed in accordance with the present invention.

With reference now to FIG. 4E wherein is shown a depiction of memory 44 at the completion of compilation of simulation model 329 with instrumentation entities FXUCHK and FPUCHK. Memory 44 contains proto data structures 481, one for each of the design and instrumentation entities referred to in simulation model 329. In addition, design and instrumentation instances in simulation model 329 are represented by instance data structures 482. The instance data structures are connected by means of pointers indicating the hierarchical nature of the instantiations of the design and instrumentation entities within simulation model 329.

A preferred embodiment of the present invention employs an event naming schema within a simulation model that prevents name collisions between events in different instrumentation entities, allows for the arbitrary re-use of components of a model in models of arbitrarily increasing size, and furthermore allows for processing designated events in a hierarchical or non-hierarchical manner.

When all instances of an event are considered as a whole without regard to specific instances, the event is considered in a "non-hierarchical" sense. Likewise, when an event is considered with regard to each and every instance, it is considered in a "hierarchical" sense. When considering count events, for example, it is often convenient to track the number of times a particular count event occurred in the aggregate without concern to exactly how many times the count event occurred in each particular instance within a simulation model.

Each type of event: count, fail, harvest, etc. is given a separate event namespace by construction. Each event class is therefore an independent group preventing naming collisions between the event types. The data structure of the present invention is independently applied to each of the different event types to ensure correctness within each event class.

In the embodiments illustrated in FIGS. 5A, 5B, 5C, and 5D, the present invention is described with respect to count events. One skilled in the art will appreciate and understand the extensions necessary to apply the same techniques to other event classes such as failure or harvest events.

With reference to FIG. 5A, there is depicted a block diagram representation of simulation model 1000 containing a number of design and instrumentation entities. As illustrated in FIG. 5A, simulation model 1000 includes two instances of a design entity X, with instance names X1 and X2 respectively.

Within each of design entity instances X1 and X2 is instantiated an instance of an instrumentation entity B3, 1012a and 1012b. Design entity instances X1 and X2 further comprise instances, 1014a and 1014b, respectively, of design entity Z which further contains instances, 1016a and 1016b, of instrumentation entity B1 and instances, 1018a and 1018b, of instrumentation entity B2.

Finally, simulation model 1000 includes an instance of design entity Y, with instance name Y, containing an instance of instrumentation entity B4 1022. Design entity instance Y contains an instance, 1024, of design entity Z with further instances, 1016c and 1018c, of instrumentation entities B1 and B2 respectively.

In what follows the methods of the present invention for uniquely naming events will be considered in the context of exemplary model 1000. It will be assumed in the following description that each instrumentation entity (B1, B2, B3, and B4) has declared a single count event with event name "count1".

In accordance with the present invention, the user must uniquely name each type of event (count, fail, harvest, etc.) within a specific instrumentation entity, i.e., the user cannot declare any two events of the same type within the same instrumentation entity with the same event name. Such a constraint does not conflict with the stated goals of the present invention in that a given instrumentation entity is usually created by a specific person at a specific point in time, and maintaining unique names within such a limited circumstance presents only a moderate burden to the user. The data structure disclosed herein does, however, prevent all name collisions between events in different instrumentation entities, and allows for processing the events in a hierarchical and/or non-hierarchical manner.

As previously explained, an HDL naming convention must uniquely identify all the entities within a given design. This constraint is inherent to HDLs and applies to design entities as well as instrumentation entities. In accordance with conventional VHDL entity naming constructs, it is technically possible for two design entities to share the same entity name, entity_name. However, such identically named entities must be encapsulated within a VHDL library from which a valid VHDL model may be constructed. In such a circumstance, entity_name, as it is utilized herein, is equivalent to the VHDL library name concatenated by a period (".") to the entity name as declared in the entity declaration.

Pre-pending a distinct VHDL library name to the entity name disambiguates entities sharing the same entity name. Most HDLs include a mechanism such as this for uniquely naming each design entity. Design entities must be unambiguously named in order to determine which particular entity is called for in any given instance in a simulation model. The present invention employs the prevailing naming mechanism of the native HDL to assign unique entity names for design entities throughout a given model and leverages the uniqueness property of entity names and the uniqueness of each instance's instantiation identifier to create an "extended event identifier" for each event within the simulation model.

With reference to FIG. 5B, there is illustrated a representation of the fields in an extended event identifier data structure, alternatively referred to herein as an "event list", in accordance with one embodiment of the present invention. The extended event identifier begins with instantiation identifier field 1030. This field, as described hereinbefore, consists of the instance identifiers, proceeding from the top level entity to the direct ancestor of the given instance within the simulation model separated by periods ("."). This string is unique for each and every instance of the event within the model. The extended event identifier further includes an instrumentation entity field 1032, a design entity field 1034, and an eventname field 1036.

Instrumentation entity field 1032 contains the name of the instrumentation entity (or the name assigned to an embedded instrumentation entity) that generates the simulation event. Design entity field 1034 contains the entity name of the design entity in which the event occurs. Eventname field 1036 is the name given to the event in the instrumentation entity description comments of an instrumentation entity or the event name assigned to an event within an embedded instrumentation entity. These four namespace fields comprise a unique identifier for each event within a simulation model that allows for the re-use of components within other models without risk of name collisions and the consideration of events in a hierarchical or non-hierarchical sense.

With reference now to FIG. 5C, there is shown a list of extended event identifiers for model 1000. Event identifiers 1040, 1041, 1042, 1043, 1044, 1045, 1046, 1047, and 1048 are declared within simulation model 1000 to designate count events having eventname "count1". The extended event identification procedure of the present invention will be described in the context of these extended event identifiers.

The uniqueness of the names in design entity name field 1034 is a primary distinguishing factor between events. By including the design entity name in the extended event identifier, each design entity is, in effect, given a unique namespace for the events associated with that design entity, i.e., events within a given design entity cannot have name collisions with events associated with other design entities.

It is still possible however, to have name collisions between events defined by different instrumentation entities that are incorporated within a single design entity. Events 1041 and 1042, for example, if identified solely by the design entity name, have a name collision. Both are events with eventname "count1" within design entity Z, and if labeled as such, are indistinguishable. In order to alleviate a naming collision between events 1041 and 1042, the present invention employs instrumentation entity field 1032. By referencing the design entity and instrumentation entity names, both of which are unique with respect to themselves and each other, a unique event namespace is created for each instrumentation entity associated with any given design entity. For example, event identifier 1041 and 1042 would be in conflict (both named Z.count1), unless the respective instrumentation entity names are included within the extended event identifier to produce names B1.Z.count1 and B2.Z.count2 for these events.

It should be noted that it is possible to uniquely name each event by using instrumentation entity name field 1032 alone. Due to the uniqueness property of instrumentation entity names, event names that are only named by the instrumentation entity name and the event name field will be necessarily unique.

However, such a naming scheme is insufficient for associating events with a given design entity. In practice, it is desirable to associate events with the design entity in which they occur rather than associating them with the potentially numerous instrumentation entities that are utilized to track them. Moreover, referencing the appropriate design entity within the eventname allows all the events associated with a given design entity to be centrally referenced without the need to ascertain the names of all the instrumentation entities associated with the given design entity. The data structure of the present invention utilizes both the instrumentation entity and design entity names in naming events for ease of reference at the cost of moderate uniqueness redundancy in the event names.

In an alternative embodiment of the present invention, the instrumentation entity name is not included within the extended event identifier. Referring to FIG. 5D, such an alternative extended event identification data structure is depicted. As shown in FIG. 5D, events are named by instantiation identifier field 1030, design entity name field 1034, and event name field 1036.

Such a data structure provides name collision protection between design entities but not within design entities. That is, the user must ensure that events names for events associated with a given design entity do not collide. In case of user error in this regard, model build tools may be utilized to detect an event name collision condition during model compilation. The alternative data structure depicted in FIG. 5D provides for simpler naming and referencing of events at the expense of requiring the user to prevent name collisions for events associated with a given design entity.

Returning to FIG. 5B, the combination of instrumentation entity field 1032, design entity name field 1034, and eventname field 1036 for a given event, provides a unique identifier for any given event without regard to multiple instantiations of the event. In order to uniquely distinguish between multiple instantiations of an event, instantiation identifier field 1030 is included in the extended event identifier. Instantiation identifier field 1030 field, by its construction, provides a unique string for any instance of an entity within any simulation model.

When evaluating occurrences of an event in a non-hierarchical sense, instantiation identifier field 1030 is ignored while searching for matching events. As illustrated in FIG. 5C, for example, a non-hierarchical query for the number of time a "count1" event occurs within design entity Z as detected by instrumentation entity B1, utilizes the following list of count eventnames:

| X1.Z | B1 | Z | COUNT1 |
| X2.Z | B1 | Z | COUNT1 |
| Y.Z | B1 | Z | COUNT1. |

These count events are added together to form an aggregate count of the total number of time the specific event occurred within the simulation model.

A hierarchical query includes specific criteria to match against the hierarchy field to limit the counter or counters found to specific instances of the requested event. For example, a query to obtain the count1 event of instrumentation entity B1 within the X1.Z instance of design entity Z utilizes the following count eventname:

| X1.Z | B1 | Z | COUNT1, | which represents the number of times the count1 event was counted by instrumentation entity B1 within design entity instance X1.Z for a particular simulation interval.

By providing matching model hierarchy criteria against instantiation identifier field 1030, it is possible to consider the events with respect to their particular instance or instances within the model, i.e., a hierarchical query. A non-hierarchical query merely ignores the hierarchy field and returns all the instances of the requested events within the model.

The above described system and method provides for practical instrumentation of simulation models and allows for efficient implementation of instrumentation logic through embedded instrumentation entities. Embedded instrumentation entities, as described hereinabove, are however necessarily limited to task-specific implementations. As described with reference to FIGS. 6A and 6B, the present invention further provides for a more flexible implementation of instrumentation logic in a more unstructured manner.

Figure 6A:
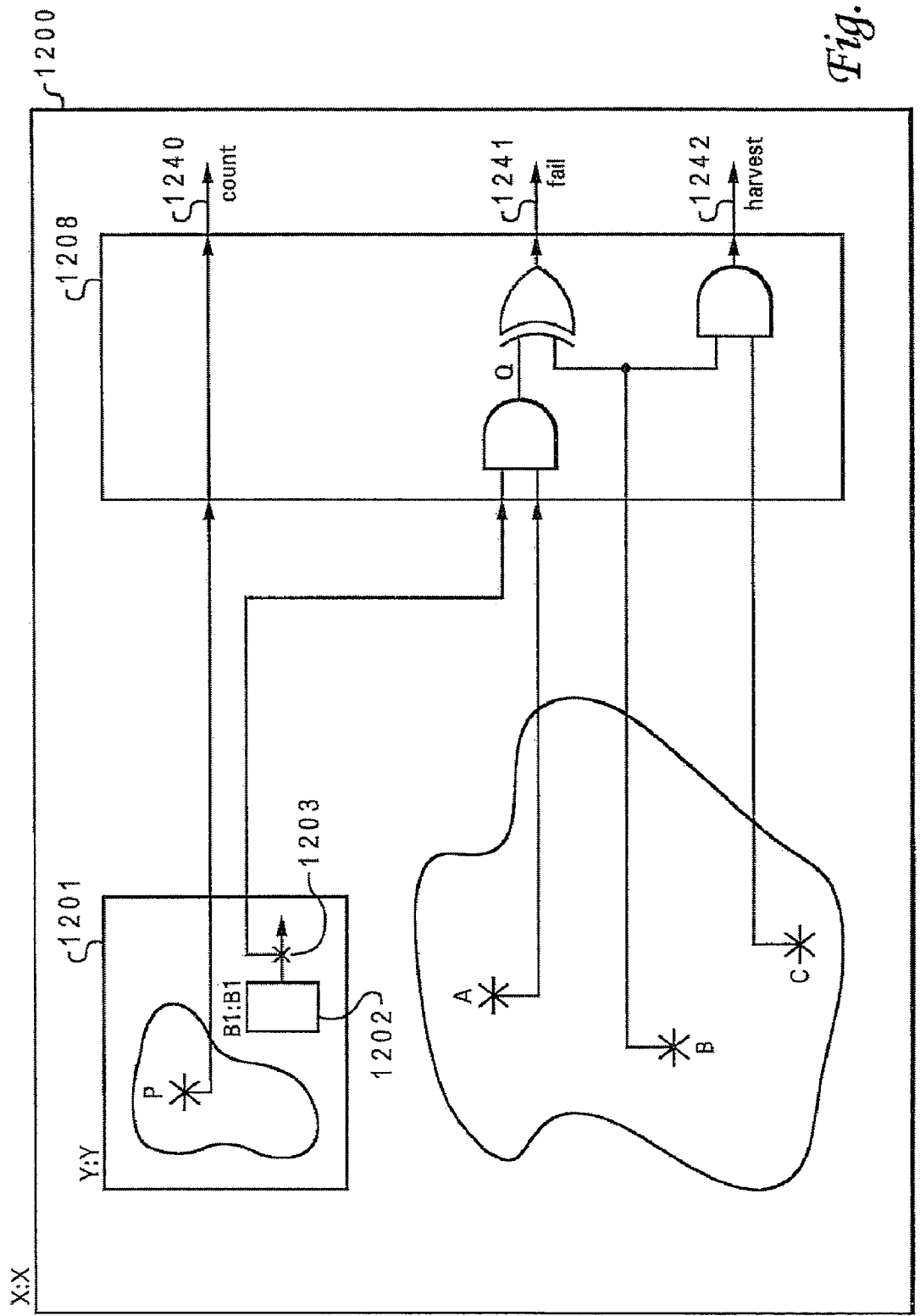
FIG. 6A depicts a representative target design entity with an instrumentation entity containing random instrumentation logic implemented in accordance with the present invention.

It is often necessary to tailor instrumentation logic to address unique problems and circumstances. Instrumentation logic of a specific and yet non-predefined nature that is designed in accordance with the techniques disclosed herein with reference to FIGS. 6A and 6B is referred herein as "random instrumentation logic." A data construct consisting of general logic primitives (Boolean operators, storage elements, etc.) and an interconnection method for these primitives is utilized for implementing such random instrumentation logic.

For instrumenting a simulation model as described heretofore, an HDL such as VHDL or Verilog is utilized as a platform from which instrumentation logic is generated. Appropriate instrumentation entity descriptor comments within design entity source code files couple the resultant instrumentation entities to designated target design entities within a simulation model.

In addition to entity descriptor comments within a design entity source code file, the foregoing instrumentation technique requires a separate HDL file in which the instrumentation entity is described. As explained with reference to FIGS. 6A and 6B, the present invention provides a method, system, and data structure for instrumenting design entities within a simulation model while avoiding the design process overhead required for creating a separate instrumentation entity HDL file.

In accordance with a preferred embodiment of the present invention, random instrumentation logic is directly deployed within target design entities in terms of individualized and customizable instrumentation descriptor comments. Such instrumentation descriptor comments are encoded within the target design entity HDL source code file and provide a means for the describing random instrumentation logic, events, and interconnections between the created instrumentation logic and the target design entity. The random instrumentation logic is inserted into the simulation model in a manner similar to the techniques used for embedded instrumentation entities to produce an instrumentation entity without the need for the creation of an explicit HDL instrumentation entity file.

With reference to FIG. 6A, there is illustrated a representative target design entity 1200 wherein random instrumentation logic is implemented in accordance with a preferred embodiment of the present invention. Instantiated within target design entity 1200 is a design entity 1201. As further depicted in FIG. 6A, an instrumentation entity 1202 is instantiated within design entity 1201. Instrumentation entity 1202 is designed in accordance with the principles set forth hereinabove to generate a count event 1203 having an event name "count1." Target design entity 1200 further includes an instrumentation entity 1208 that is generated utilizing random instrumentation logic. As depicted in FIG. 6A, instrumentation entity 1208 receives as inputs signals P, A, B, and C along with count event 1203.

In this example, instrumentation entity 1208 is constructed by a set of unconventional comments lines within the source code file for target design entity 1200. These comments may be incorporated at any point within the logic description section of the HDL source code file. HDL compiler 462 (FIG. 4B) recognizes the unconventional comments in addition to any comments utilized to instantiate embedded instrumentation entities within design entity 1200. During the post-compilation/model build phase, instrumentation load tool 464 processes these comments in a manner similar to that utilized for embedded instrumentation entities to generate instrumentation entity 1208.

A variety of possible syntaxes can be utilized to formulate the unconventional comments required for generating random instrumentation logic within the HDL source code file of a target design entity. As depicted in FIG. 6B, it is presently preferred if the instrumentation comments are written in an instrumentation language that differs from conventional HDLs, but employ a syntax similar to the concurrent subset of VHDL to promote ease of use. In addition, the instrumentation language preferably includes syntactic and semantic enhancements that facilitate connection between an instrumentation entity and its target design entity and the declaration of events and intermediate signals.

With reference now to FIG. 6B, there is illustrated an exemplary HDL source code file 1220 that describes design entity 1200. Within HDL source code file 1220, an entity instantiation 1221 produces design entity 1201, and assignment statements 1222 are utilized to generate signals A, B, and C. A set of unconventional instrumentation comments 1223 within HDL source code file 1220 is utilized to produce instrumentation entity 1208.

Instrumentation comments 1223 for count, fail and harvest events are formulated as left-hand side (l.h.s.)/right-hand side (r.h.s.) assignment statements of the form:

$$\{l.h.s.\}<=\{r.h.s.\};$$

where {l.h.s.}, referred to herein after as lhs, is the assignment statement target and, {r.h.s.}, referred to herein after as rhs, is an expression denoting the logical value to be assigned to the statement lhs. A number of rules delineate the possible expressions for lhs and rhs in any legal statement in the instrumentation comments.

As employed within the instrumentation data structure of the present invention, an lhs statement may be either an event declaration or the name of a signal that is instantiated within an instrumentation entity. An event declaration is an expression within bracket characters ("[A, A]") that generates a new event. Within instrumentation comments 1223, a statement 1230 produces a count event 1240 from instrumentation entity 1208 (FIG. 6A) having eventname "countname0".

Within an lhs event declaration, a first field designates the event type (count, fail, harvest, etc.) and is followed by such other fields as are necessary to declare the event. As illustrated in lines 1230, 1234, and 1236, such event declaration fields generally follow the same format as the event declaration fields depicted in FIG. 4C.

Instrumentation comments 1223 further include a line 1232 having an lhs that declares a signal Q within instrumentation entity 1208. To prevent ambiguity, any signal declared in this manner may not have a name corresponding to the name of any signal present on the top level of target design entity 1200. Conformance to this requirement is verified by instrumentation load tool 464 (FIG. 4D) during processing. Signals declared by an lhs expression may be incorporated within an rhs expression as shown in lines 1232 and 1234.

An rhs consists of logical connectivity expressions and/or functions that combine various signals. Signals within these connectivity expressions may originate from a number of possible sources including: signals declared on the lhs of a statement in the instrumentation comments; signals within the target design entity; or signals designating other events within the target design entity.

The absence of period (".") or bracket ("[","]") characters within a signal value description in the rhs of a statement, designates the object signal as corresponding to either a signal within the top hierarchical level of the target design entity or to a signal declared on the lhs of a statement within the instrumentation language. Signals are named in a mutually exclusive manner by the rules governing creation of signals on the lhs of a statement in the instrumentation comments, thereby preventing any ambiguity in the determining the source of the given signal.

Signals in rhs connectivity expressions can also be specified as being located within entities instantiated within the target design entity. In such a circumstance, the instance names of the entity or entities in the hierarchy enclosing the desired signal are placed before the signal name in hierarchy order, delineated by period (".") characters. For example, the signal in statement 1230 ("Y.P") represents signal 1204 within design entity 1201. Signals at any level of the target design hierarchy are thus accessible to instrumentation logic generated by the instrumentation language comments.

Signals within the instrumentation comment expressions can also designate other events within the target entity. Event identifiers as described hereinbefore for hierarchical events are used to denote such "event" signals. For example, statement 1232 performs a logical AND of instrumentation event 1203 and signal A The event identifier "Y.[B1.count.count1]" connects instrumentation entity 1208 to instrumentation event 1203. This notation permits instrumentation events at any level of design hierarchy within target design entity 1200 to be directly accessed.

As further depicted in FIG. 6B, statement 1232 produces intermediate signal Q within instrumentation entity 1208. This is an example of an instrumentation comment statement declaring a new intermediate signal. These signals can be used in other statements to construct random instrumentation logic of any desired depth or complexity.

Statement 1234 utilizes intermediate signal Q along with signal 1206 to produce fail event 1241. The syntax for fail event declaration includes a field denoting the type of event ("fail"), a field giving the event name for the fail event ("failname0"), and a final field denoting the message to associate with the fail. Finally, statement 1236 produces harvest event 1242.

In general, the rhs expression of any statement in the instrumentation data structure of the present invention can access any signal or instrumentation event signal within the target design entity utilizing these syntactic mechanisms. These signals can be combined to form new events or intermediate signals that can themselves be further combined to form instrumentation logic of any desired depth or complexity.

Instrumentation comments can be placed anywhere within the logic description section of the design HDL source code file of the target design entity. All instrumentation comments within a file are considered as a whole and produce a single instrumentation entity within the target design entity.

Figure 7A:
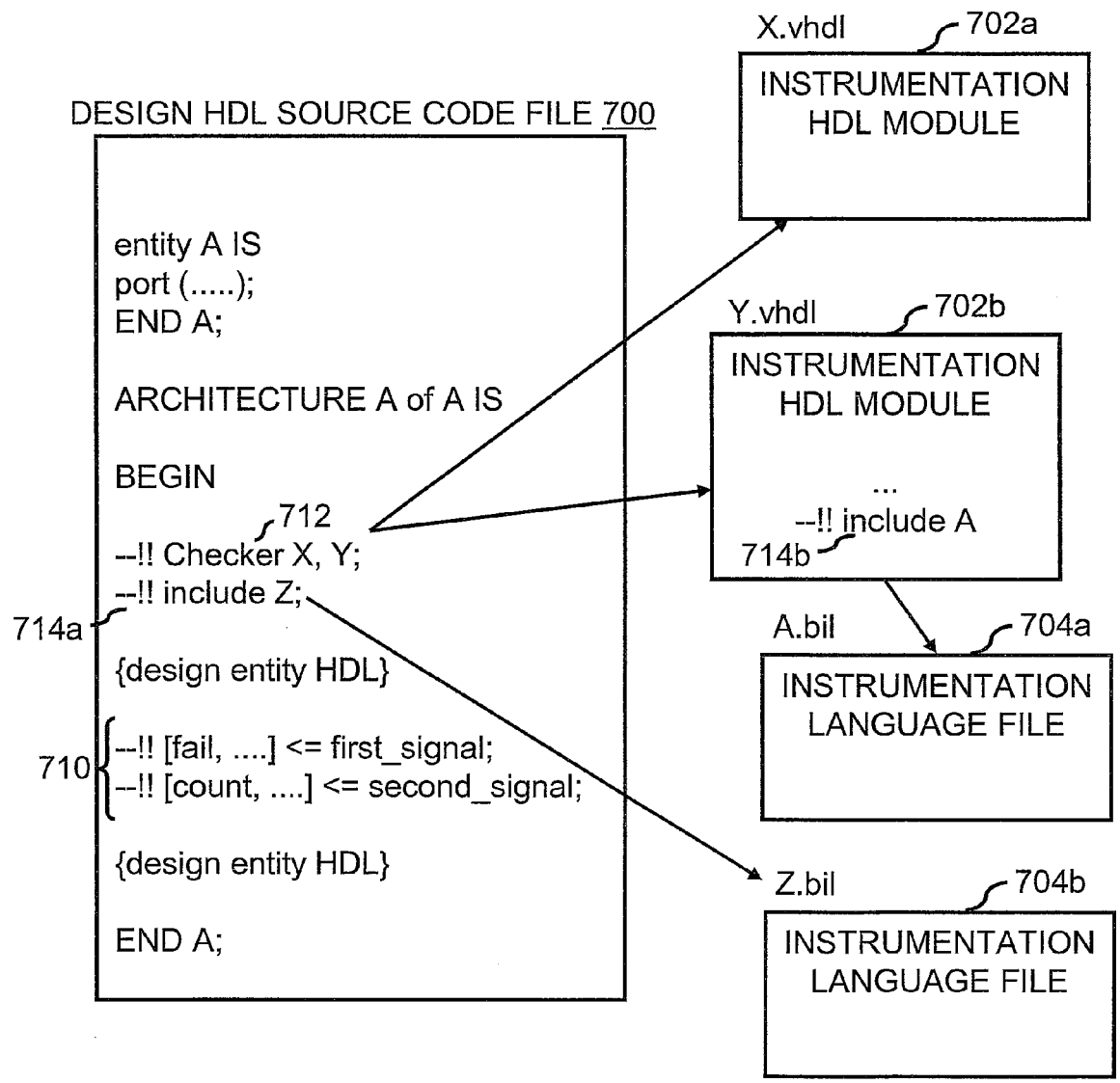
FIG. 7A depicts an exemplary collection of files for implementing instrumentation logic in accordance with the present invention.

Referring now to FIG. 7A, which depicts an exemplary collection of files for implementing random instrumentation logic in accordance with the present invention, it will further be appreciated that the definition of random instrumentation logic is not restricted to design HDL source code files, such as design HDL source code file 1220 of FIG. 6B. Instead, as shown in FIG. 7A, random instrumentation logic may be defined in one or more files in a collection of files, including a design HDL source code file 700, instrumentation HDL modules 702a, 702b, and instrumentation language files 704a, 704b.

In the depicted collection of files, instrumentation comments 710 set forth within design HDL source code file 700 in the manner previously described with respect to FIG. 6B are utilized to define random instrumentation logic within the target design entity described by design HDL source code file 700. In addition, random instrumentation logic is defined through the inclusion within design HDL source code file 700 of an external HDL file reference 712 comprising a keyword (e.g., "Checker") followed by a comma-delimited list of file names (e.g., "X" and "Y") denoting one or more instrumentation HDL modules 702a, 702b that each defines an instrumentation entity utilizing HDL as previously described with reference to FIG. 4C. In this case, the instrumentation HDL module(s) referenced by design HDL source code file 700 are identified by the file extension ".vhdl". Random instrumentation logic may further be instantiated within the target design entity described by design HDL source code file 700 through the use of an include statement 714a within design HDL source code file 700 that incorporates by reference an instrumentation language file 704b or through the use of an include statement 714b within an instrumentation HDL module 702b that incorporates by reference an instrumentation language file 704a. Instrumentation language files 704, which are identified by the file extension ".bil", describe random instrumentation logic utilizing the same instrumentation language employed within instrumentation comments 710, except that the comment designation "--!!" may be omitted. The instrumentation language statements within instrumentation language files 704 are interpreted by instrumentation load tool 464 as if they appeared in design HDL source code file 700 or instrumentation HDL module 702b at the point at which reference to an external file 702 or 704 is made.

As will be appreciated by those skilled in the art, the ability to describe instrumentation logic in one or more files among a collection of files as shown in FIG. 7A has a number of advantages. First, instrumentation statements can be placed directly within instrumentation language files 704 to avoid cluttering a design HDL source code file 700. Second, by permitting common instrumentation constructs to be described in a non-HDL instrumentation language, the input required by a designer to create random instrumentation logic is significantly reduced as compared with that required when using a conventional HDL. Third, if a designer feels more comfortable utilizing a conventional HDL to describe particular instrumentation logic or if the instrumentation language does not support a particular desired instrumentation construct, a designer can revert to using a conventional HDL, with all its attendant power, to describe the random instrumentation logic within an instrumentation HDL module 702a or 702b.

The instrumentation language of the present invention preferably includes support to instrument a target design entity (e.g., the design entity corresponding to design HDL source code file 700) with sequential logic elements such as latches and master-slave flip-flops (MSFFs). For example, to instantiate a latch 720 as shown in FIG. 7B, the following exemplary instrumentation language statement can be employed:

$B<=[A]@(CLOCK1);$

This instrumentation statement indicates that instrumentation load tool 464 is to create within the target design entity a storage element, as denoted by a single pair of square brackets ("[ ]"), which has the signal A as its data input and signal B as its data output. The instrumentation statement further indicates that the storage element is to be an individual latch rather than an MSFF in that only a single clock qualifier (i.e., CLOCK1) is specified for the storage element.

Figure 7B:
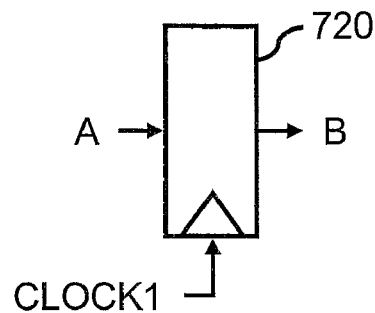
FIGS. 7B-7D depict exemplary sequential instrumentation logic that may be declared by the collection of files depicted in FIG. 7A.
Figure 7C:
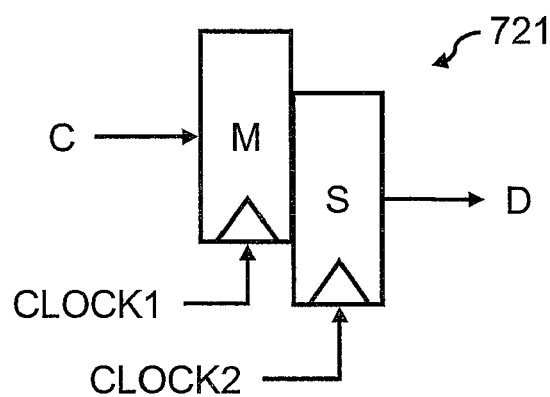

Similarly, a master-slave flip-flop (MSFF) 721 as shown in FIG. 7B can be declared within a target design entity of a digital design with an instrumentation language statement employing the following syntax:

D<=[C]@(CLOCK1, CLOCK2);

In this exemplary syntax, a storage element is again indicated by the pair of square brackets enclosing an input signal name, and an MSFF is indicated by a clock qualifier having two terms, identifying the master and slave latch clocks, respectively.

To reduce the amount of input required to instantiate multiple latches in a single clock domain, the instrumentation language of the present invention preferably permits a default clock qualifier to be declared for multiple latches as follows:

CLOCK: (CLOCK3);
F<=[E];
H<=[G]@(CLOCK4);
J<=[I]@(CLOCK4,CLOCK5);
L<=[K];

In this example, the clock qualifier statement "CLOCK: (CLOCK3);" declares the default instrumentation latch type to be an individual latch (as opposed to a MSFF) and CLOCK3 to be the default clock for all subsequent instrumentation latch declarations, unless the default latch type or default clock is explicitly overridden for a particular latch by the enumeration of a different clock signal or until a different clock qualifier statement is reached. Thus, utilizing this syntax, CLOCK3 is the clock signal that drives the individual instrumentation latches of input signals E and K, CLOCK4 is the clock signal that drives the individual instrumentation latch of input signal G, and CLOCK4 and CLOCK5 are the master clock and slave clock, respectively, of the MSFF of input signal I.

The instrumentation language preferably permits a default clock qualifier to be similarly declared for MSFFs as follows:

CLOCK: (CLOCK6, CLOCK7);
N<=[M];
P<=[O]@(CLOCK8);
R<=[Q]@(CLOCK9, CLOCK10);
T<=[S];

In this example, the clock qualifier statement "CLOCK: (CLOCK6, CLOCK7);" declares the default instrumentation latch to be an MSFF and CLOCK6 and CLOCK7 to be the default master and slave clocks, respectively, for all subsequent instrumentation latch declarations, unless the default latch type or default clock is explicitly overridden for a particular latch by the enumeration of different clock signal(s) or until a different clock qualifier statement is reached. Thus, utilizing this syntax, CLOCK6 and CLOCK7 are the master and slave clock signals that drives the MSFFs that latch input signals M and S, CLOCK8 is the clock signal that drives the individual instrumentation latch of input signal O, and CLOCK9 and CLOCK10 are the master clock and slave clock, respectively, of the MSFF of input signal Q.

It is presently preferable if instrumentation load tool 464 interprets a clock qualifier statement within an instrumentation language file 704b incorporated by reference into a design HDL source code file 700 by an include statement 714a as if that clock qualifier were present in design HDL source code file 700 itself at the location of the include statement 714a. Clock qualifier statements preceding an include statement 714a in design HDL source code file 700 similarly apply the specified clock domain to the instrumentation language file 704b incorporated by the include statement 714a, unless explicitly overridden or replaced by a different default clock qualifier declared within the instrumentation language file 704b.

Figure 7D:
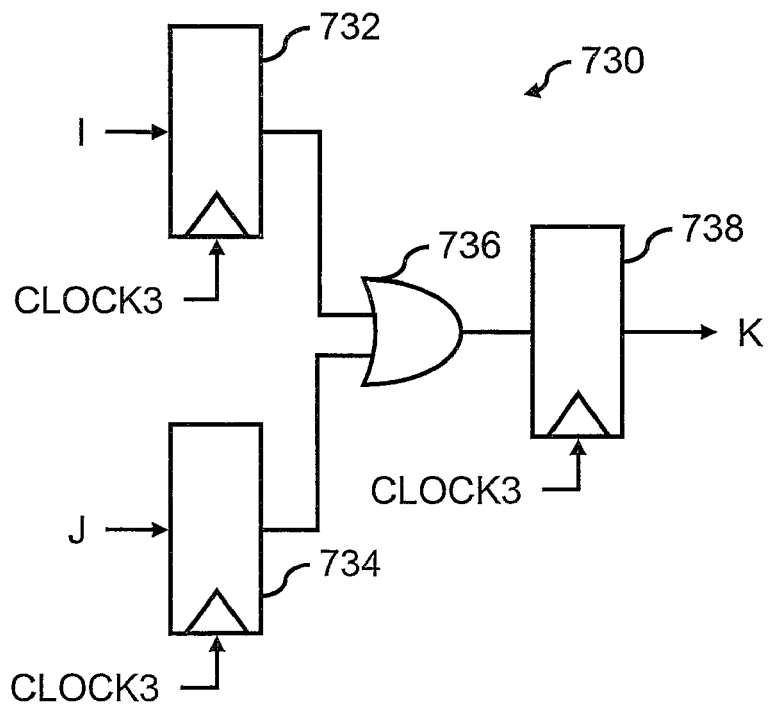

The described instrumentation language can be employed to declare sequential instrumentation logic of any arbitrary depth and complexity. For example, with reference to FIG. 7D, random instrumentation logic 730, which includes individual latches 732, 734, and 738 and a OR gate 736, may be declared for a target design entity utilizing the following syntax:

K<=[[I] @(CLOCK3) OR [J] @(CLOCK3)]
   @(CLOCK3);

where the outer pair of square brackets instantiates latch 738, the inner bracket pairs instantiate latches 732 and 734, and the logical operator "OR" instantiates OR gate 736. If a default clock qualifier for CLOCK3 has been declared, this statement can further be simplified as:

K<=[[I] OR [J]];

As will be appreciated, these examples are merely exemplary, and additional levels of depth and complexity can be achieved by employing other or additional logical operators (AND, NOR, NOT, etc.) and by utilizing additional bracket pairs to indicate storage elements. In addition, it should be understood that expressions and the use of latches are permitted not only in signal declarations, but in clock qualifiers as well. Further, although all the examples given herein employ single-bit signals, any of the signals could comprise multi-bit vectors.

Figure 8A:
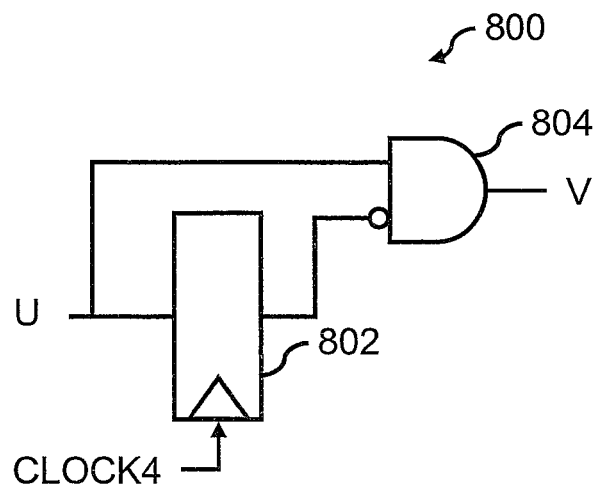
FIGS. 8A-8B illustrate exemplary sequential instrumentation logic that may be declared by calling a signal sense helper function in accordance with the present invention.
Figure 8B:
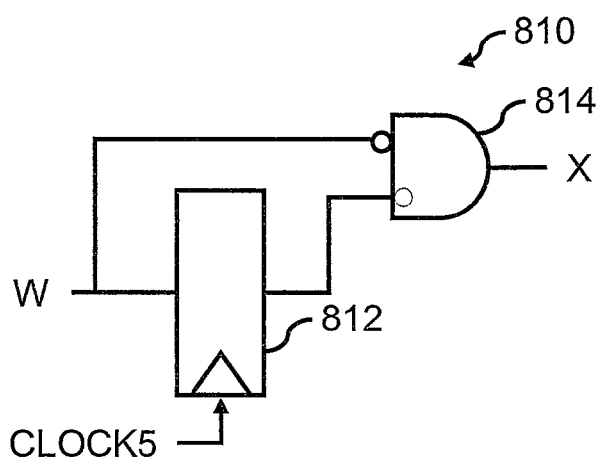

The instrumentation language of the present invention preferably further supports helper functions to further facilitate the declaration of predefined sequential logic constructs. Referring to FIGS. 8A-8B, two sequential logic circuits 800, 810 are illustrated that can be declared as instrumentation of a target design entity by referencing a signal sense helper function in accordance with the present invention. For example, sequential logic circuit 800 of FIG. 8A, which includes a latch 802 coupled to the inverting input of a two-input AND gate 804 and the latch input signal coupled to the non-inverting input of AND gate 804, can be declared utilizing the following statement, which calls the UP signal sense helper function:

V<=UP(U)@(CLOCK4);

As will be appreciated, sequential logic circuit 800 asserts output V of AND gate 804 when input signal U has an upward transition from logic low to logic high. Of course, if a default clock qualifier for CLOCK4 has already been declared, this statement can be simplified as:

V<=UP(U);

Sequential logic circuit 810 of FIG. 8B, which includes a latch 812 coupled to the non-inverting input of an AND gate 814 and the latch input signal coupled to the inverting input of AND gate 814, can be declared utilizing the following statement, which calls the DOWN signal sense helper function:

X<=DOWN(W)@(CLOCK5);

As will be appreciated, sequential logic circuit 810 asserts output X of AND gate 814 when input signal W has a downward transition from logic high to logic low. Of course, if a default clock qualifier for CLOCK5 has already been declared, this statement can be simplified as:

X<=DOWN(W);

For both UP and DOWN helper functions, an MSFF can be utilized in place of the individual latch simply by specifying the appropriate clock qualifier.

Figure 9:
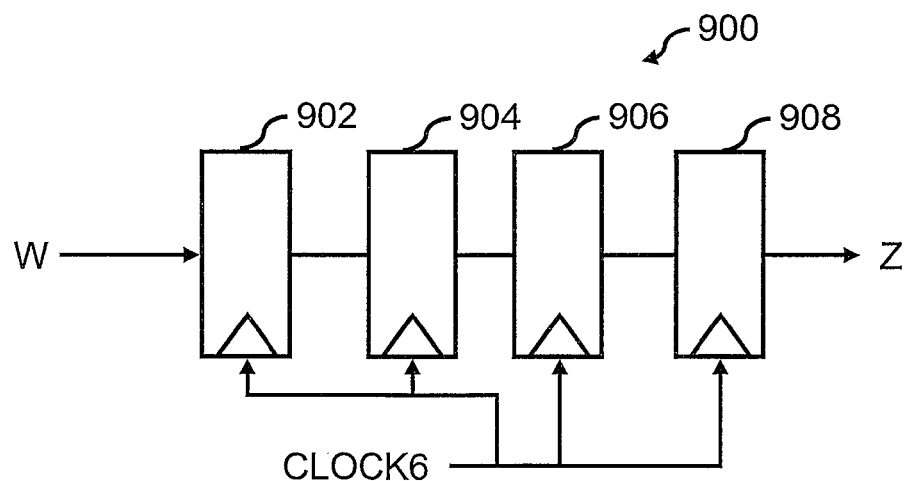
FIG. 9 depicts exemplary sequential instrumentation logic that may be declared by calling a delay helper function in accordance with the present invention.

FIG. 9 depicts an exemplary delay circuit 900 that can be instantiated as instrumentation of a simulation model through calling a DELAY helper function of the instrumentation language of the present invention. As shown, delay circuit 900 includes four sequentially connected latches 902, 904, 906 and 908 that apply a cumulative four cycle delay to input signal W to obtain an output signal Z. Delay circuit 900 can be declared as instrumentation of a target design entity by calling the DELAY helper function as follows:

Z<=DELAY(W,4)@(CLOCK6);

In this exemplary syntax, DELAY is a keyword that calls the DELAY helper function, the first parenthetical term identifies the input signal, the second parenthetical term is an integer identifying the desired number of delay latches, and the term following the "@" sign identifies the clock signal that drives the delay latches. Of course, one or more MSFFs can be utilized as delay elements by specifying in this statement or in a default clock qualifier declaration a pair of latch clock signals. It will further be appreciated from the foregoing description that delay circuit 900 may alternatively be declared utilizing square brackets to indicate latches as follows (assuming a default clock qualifier):

Z<=[[[[W]]]];

With reference now to FIGS. 10A-10H, there are illustrated exemplary instrumentation flag circuits that may be instantiated within a HDL simulation model through calling a flag helper function in accordance with the present invention. As will be appreciated, flag helper functions are intended to permit a designer to establish an instrumentation flag that is set when a set term derived from the HDL simulation model is asserted and is reset when a reset when a reset term derived from the HDL simulation model is asserted. FIGS. 10A-10D depict reset-dominant flag circuits, and FIGS. 10E-10H depict set-dominant flag circuits. Although all of the exemplary flag circuits depicted in FIGS. 10A-10H utilize individual latches, it should be understood that MSFFs can alternatively be employed in any of the flag circuits simply by specifying the appropriate clock qualifier.

Exemplary syntax for declaring a instrumentation flag circuit is given as follows:

typeFLAG<=(set_term+, reset_term+)@(clock_qualifier);

In this exemplary syntax, the keyword FLAG indicates a call to the flag helper function, set_term is the term derived from one or more design and/or instrumentation signals in the HDL simulation model that governs when the instrumentation flag is set, reset_term is the term derived from one or more design and/or instrumentation signals the HDL simulation model that governs when the instrumentation flag is reset, and clock_qualifier, if present, identifies the latch or MSFF clock signal(s). In addition, type, which may have the value of S (for set), R (for reset), or null, indicates whether the flag is set dominant, reset dominant or neither, respectively. In other words, the type indicates whether the state of the flag will be set, reset or be an error if both the set_term and reset_term are asserted. The optional duration indication "+" further indicates whether the output will be asserted during the cycle(s) in which the set_term and reset_term are asserted. For simplicity, it will hereafter be assumed that the set_term and reset_term are asserted for only a single cycle; the operation of instrumentation flag circuits with assertions of the set_term and/or reset_term for multiple cycles will be well understood from the following description and associated drawings.

Figure 10A:
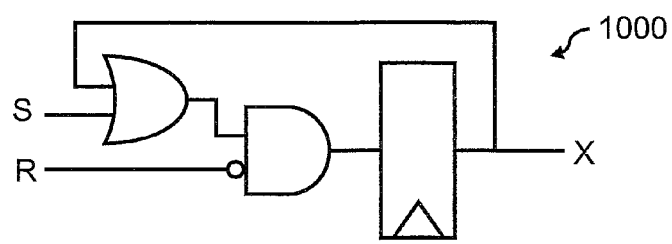
FIGS. 10A-10D illustrate exemplary reset-dominant instrumentation flag circuits that may be declared by calling a flag helper function in accordance with the present invention.

Employing the exemplary instrumentation language syntax given above, the exemplary reset-dominant flag circuit 1000 depicted in FIG. 10A may be declared utilizing the following instrumentation statement (assuming a default clock qualifier has been previously declared):

X<=RFLAG(S,R+);

In exemplary instrumentation flag circuit 1000, output X is asserted at the end of cycle that set term S is asserted and deasserted at the end of the cycle that reset term R is asserted, unless set term S and reset term R are asserted during the same cycle. In this case, X is not asserted.

Figure 10B:
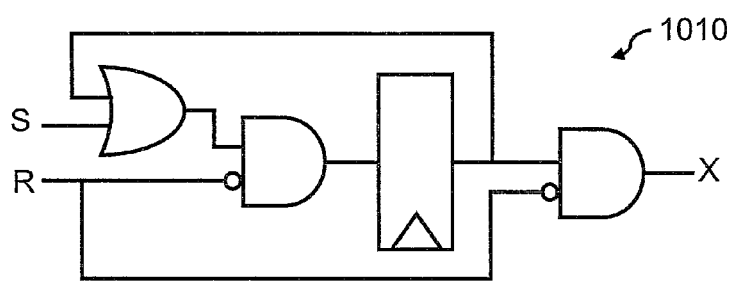

Referring now to FIG. 10B, the exemplary reset-dominant flag circuit 1010 illustrated therein may be declared utilizing the following instrumentation statement (assuming a default clock qualifier has been previously declared):

X<=RFLAG(S,R);

In exemplary instrumentation flag circuit 1010, output X is asserted at the end of the cycle that set term S is asserted and deasserted at the beginning of the cycle that reset term R is asserted, unless set term S and reset term R are asserted during the same cycle or unless the set term S is asserted in the cycle immediately preceding the cycle in which the reset term R is asserted. In such cases, X is not asserted.

Figure 10C:
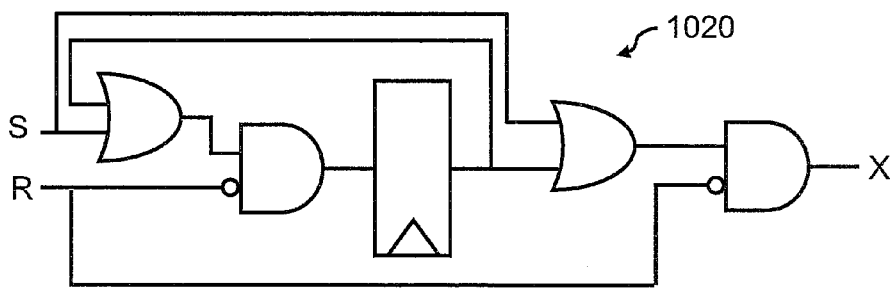

With reference now to FIG. 10C, the exemplary reset-dominant flag circuit 1020 depicted therein may be declared utilizing the following instrumentation statement (assuming a default clock qualifier has been previously declared):

X<=RFLAG(S+,R);

In exemplary instrumentation flag circuit 1020, output X is asserted at the beginning of the cycle that set term S is asserted and deasserted at the beginning of the cycle that reset term R is asserted, unless set term S and reset term R are asserted during the same cycle. In this case, X is not asserted.

Figure 10D:
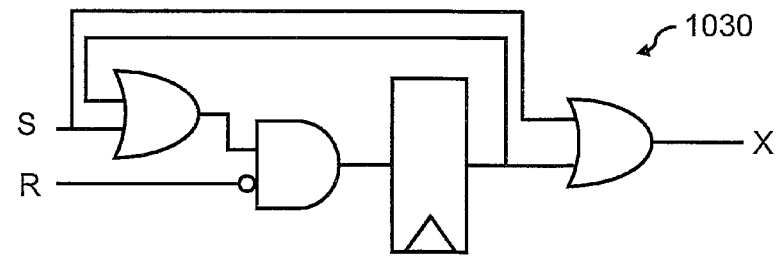

Referring now to FIG. 10D, the exemplary reset-dominant flag circuit 1030 illustrated therein may be declared utilizing the following instrumentation statement (assuming a default clock qualifier has been previously declared):

X<=RFLAG(S+,R+);

In exemplary instrumentation flag circuit 1030, output X is asserted at the beginning of the cycle that set term S is asserted and deasserted at the end of the cycle that reset term R is asserted.

Figure 10E:
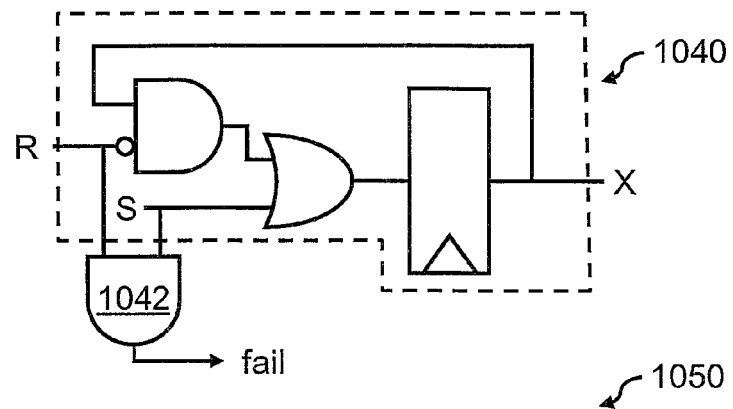
FIGS. 10E-10H depict exemplary set-dominant instrumentation flag circuits that may be declared by calling a flag helper function in accordance with the present invention.

With reference now to FIG. 10E, the exemplary set-dominant flag circuit 1040 depicted therein may be declared utilizing the following instrumentation statement (assuming a default clock qualifier has been previously declared):

X<=SFLAG(S,R+);

In exemplary instrumentation flag circuit 1040, output X is asserted at the end of the cycle that set term S is asserted and deasserted at the end of the cycle that reset term R is asserted, unless set term S and reset term R are asserted during the same cycle. In this case, X will not make a downward transition until reset term R is again asserted.

Because a reset failure occurs for flag circuit 1040 of FIG. 10E in operating scenarios in which set term S and reset term R are concurrently asserted (and a similar set failure occurs for flag circuit 1000 of FIG. 10A), it may be desirable to enable the recording of such cycles as a fail event (e.g., named reset_failure) by instead declaring the instrumentation flag circuit without set or reset dominance, as follows:

$X$<=FLAG($S,R$+);

In response to this instrumentation language statement, instrumentation load tool 464 preferably automatically generates the necessary random instrumentation logic (e.g., AND gate 1042 of FIG. 10E) to detect the reset (or set) failure and record the failure in failure flags 424. Such automation provides useful functionality to the designer for a common flag circuit implementation without the designer having to explicitly type an equivalent instrumentation language statement, such as:

[fail, reset_failure, "set/reset overlap"]<=$S$ AND $R$

In this manner, the designer can employ set and reset dominant flag circuits in cases in which coincidence of the set and reset terms is permissible without a failure event being signaled, and can otherwise employ a flag circuit having no dominant term in circumstances in which the coincidence of the set and reset terms is an error.

Figure 10F:
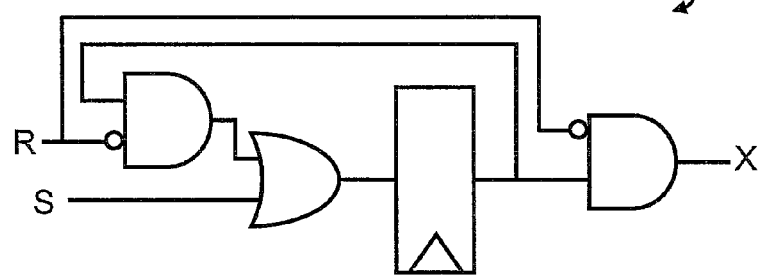

Referring now to FIG. 10F, the exemplary set-dominant flag circuit 1050 depicted therein may be declared utilizing the following instrumentation statement (assuming a default clock qualifier has been previously declared):

$X$<=SFLAG($S,R$);

In exemplary instrumentation flag circuit 1050, output X is asserted at the end of the cycle in which set term S is asserted and deasserted at the beginning of the cycle reset term R is asserted. Consequently, X will not make a downward transition if set term S and reset term R are asserted concurrently or if reset term R is asserted in the cycle immediately following the cycle in which set term S is deasserted.

Figure 10G:
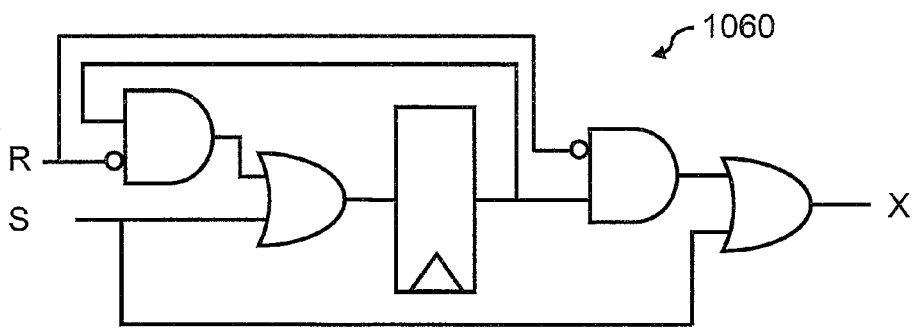

With reference now to FIG. 10G, the exemplary set-dominant flag circuit 1060 depicted therein may be declared utilizing the following instrumentation statement (assuming a default clock qualifier has been previously declared):

$X$<=SFLAG($S$+,$R$);

In exemplary instrumentation flag circuit 1060, output X is asserted at the beginning of the cycle in which set term S is asserted and deasserted at the beginning of the cycle in which reset term R is asserted, unless set term S and reset term R are asserted during the same cycle. In this case, X will not be deasserted until reset term R is asserted again. As described above with reference to FIG. 10E, recording of this event as a reset failure can be automatically supported by instead declaring a flag circuit having no dominant input term (i.e., FLAG (S+,R)).

Figure 10H:
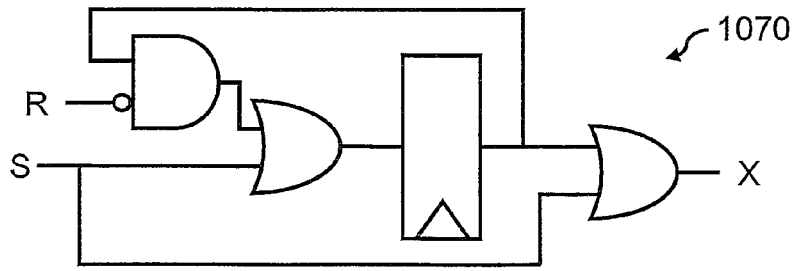

Referring now to FIG. 10H, the exemplary set-dominant flag circuit 1070 illustrated therein may be declared utilizing the following instrumentation statement (assuming a default clock qualifier has been previously declared):

$X$<=SFLAG($S$+,$R$+);

In exemplary instrumentation flag circuit 1070, output X is asserted at the beginning of the cycle in which set term S is asserted and deasserted at the end of the cycle in which reset term R is asserted, unless set term S and reset term R are asserted during the same cycle. In this case, X will not be deasserted until reset term R is again asserted. Again, recording of this event as a reset failure can be automatically supported by declaring a flag circuit having no dominant input term.

As has been described, the present invention provides a method, system and program product supporting the declaration of random instrumentation logic (including sequential instrumentation logic) for an HDL simulation model utilizing a non-HDL simulation language. Instrumentation statements in the instrumentation language can be placed within comments in a design HDL source code file or in a separate file incorporated within the design HDL source code file(s) by reference. The instrumentation language of the present invention facilitates the declaration of sequential instrumentation logic, such as latches and MSFFs. In addition, the instrumentation language provides helper functions that simplify the declaration of frequently used instrumentation constructs, such as signal sense circuits, flag circuits and delay circuits.

While the invention has been particularly shown as described with reference to a preferred embodiment, it will be understood by those skilled in the art that various changes in form and detail may be made therein without departing from the spirit and scope of the invention. For example, although the instrumentation language of the present invention has been described utilizing exemplary syntax, it should be understood that the present invention is not restricted to the particular syntax utilized herein, but is instead applicable to other syntaxes. In addition, one of the embodiments of the invention can be implemented as program code resident in random access memory 28 of one or more computer systems configured generally as described in FIG. 1 and FIG. 2. Until required by computer system 10, the program code may be stored in another computer readable storage device, such as disk drive 33 or in a removable storage device such as an optical disk for eventual use in a CD-ROM drive or a floppy disk for eventual use in a floppy disk drive. Such program code resident within a computer readable storage medium may be referred to as program product. Further, the program code can be stored in the memory of another computer and transmitted over a local area network or a wide area network, such as the Internet, when desired by the user.

What is claimed is:

1. A method of simulation processing in a data processing system, said method comprising:
receiving a collection of files including one or more HDL source files, wherein:
the one or more HDL source files describe a plurality of hierarchically arranged design entities collectively representing a digital design to be simulated;
the one or more HDL source files include a statement specifying inclusion, within one of the plurality of design entities, of an instrumentation entity described in the collection of files, wherein said instrumentation entity does not form a portion of the digital design but enables observation of its operation during simulation, said instrumentation entity including sequential logic containing at least one storage element, the instrumentation entity having an output signal capable of indicating occurrence of an event during simulation;
processing the collection of files to obtain an instrumented simulation executable model, wherein the processing includes:
instantiating, within said instrumented simulation executable model, at least one instance of each of the plurality of design entities;

instantiating said instrumentation entity within each instance of said one of said plurality of design entities;

instantiating, within said instrumented simulation executable model, external instrumentation logic to record occurrences of the event, wherein said external instrumentation logic is logically coupled to each instance of said instrumentation entity; and recording the instrumented simulation executable model in data storage; and wherein said collection of files describes at least a portion of said instrumentation entity utilizing a non-HDL instrumentation language and includes:

a first instrumentation language statement in the non-HDL instrumentation language that defines a default clock qualifier specifying at least one latch clock applicable to one or more second instrumentation language statements; and the one or more second instrumentation language statements describing said sequential instrumentation logic to which said default clock qualifier applies, wherein the one or more second instrumentation language statements describe the sequential instrumentation logic without reference to the at least one latch clock.

2. The method of claim 1, wherein the collection of files includes at least one non-HDL file containing at least the first instrumentation language statement.

3. The method of claim 1, wherein the collection of files includes an instrumentation HDL source file describing at least a portion of said instrumentation entity in an HDL.

4. The method of claim 1, wherein said collection of files declares at least a portion of said sequential logic by referencing a predefined helper function of said non-HDL instrumentation language.

5. The method of claim 4, wherein:
said sequential logic includes a instrumentation flag circuit instantiated by the predefined helper function; and
said storage element comprises a latch for holding a state of a flag.

6. The method of claim 1, and further comprising:
simulating the digital design by applying a testcase to the instrumentation simulation executable model; and
recording results of said simulation in data storage.

7. A data processing system, comprising:
a processing unit;
data storage coupled to the processing unit; and
model build program code within the data storage and executable by the processing unit to receive a collection of files including one or more HDL source files, to generate therefrom an instrumented simulation executable model, and to record the instrumented simulation executable model in said data storage, wherein:
the one or more HDL source files describe a plurality of hierarchically arranged design entities collectively representing a digital design to be simulated;
the one or more HDL source files include a statement specifying inclusion, within one of the plurality of design entities, of an instrumentation entity described in the collection of files, wherein said instrumentation entity does not form a portion of the digital design but enables observation of its operation during simulation, said instrumentation entity including sequential logic containing at least one storage element, the instrumentation entity having an output signal capable of indicating occurrence of an event during simulation;
the instrumented simulation executable model includes at least one instance of each of the plurality of design entities and each instance of said one of said plurality of design entities includes an instance of said instrumentation entity;
the model build program code instantiates, within said instrumented simulation executable model, external instrumentation logic to record occurrences of the event, wherein said external instrumentation logic is logically coupled to each instance of said instrumentation entity; and
wherein said collection of files describes at least a portion of said instrumentation entity utilizing a non-HDL instrumentation language and includes:
a first instrumentation language statement in the non-HDL instrumentation language that defines a default clock qualifier specifying at least one latch clock applicable to one or more second instrumentation language statements; and
the one or more second instrumentation language statements describing said sequential instrumentation logic to which said default clock qualifier applies, wherein the one or more second instrumentation language statements describe the sequential instrumentation logic without reference to the at least one latch clock.

8. The data processing system of claim 7, wherein the collection of files includes an instrumentation HDL source file describing at least a portion of said instrumentation entity in an HDL.

9. The data processing system of claim 7, wherein:
said collection of files describes at least a portion of said instrumentation entity utilizing a non-HDL instrumentation language; and
said collection of files declares at least a portion of said sequential logic by referencing a predefined helper function of said non-HDL instrumentation language.

10. The data processing system of claim 9, wherein:
said sequential logic includes a instrumentation flag circuit instantiated by the predefined helper function; and
said storage element comprises a latch for holding a state of a flag.

11. A program product, comprising:
a computer readable data storage medium; and
model build program code within the data storage medium and executable by a data processing system to receive a collection of files including one or more HDL source files, to generate therefrom an instrumented simulation executable model, and to record the instrumented simulation executable model in a data storage system, wherein:
the one or more HDL source files describe a plurality of hierarchically arranged design entities collectively representing a digital design to be simulated;
the one or more HDL source files include a statement specifying inclusion, within one of the plurality of design entities, of an instrumentation entity described in the collection of files, wherein said instrumentation entity does not form a portion of the digital design but enables observation of its operation during simulation, said instrumentation entity including sequential logic containing at least one storage element, the instrumentation entity having an output signal capable of indicating occurrence of an event during simulation;
the instrumented simulation executable model includes at least one instance of each of the plurality of design entities and each instance of said one of said plurality of design entities includes an instance of said instrumentation entity; and the model build program code instantiates, within said instrumented simulation executable model, external instrumentation logic to record occurrences of the event, wherein said external instrumentation logic is logically coupled to each instance of said instrumentation entity; and wherein said collection of files describes at least a portion of said instrumentation entity utilizing a non-HDL instrumentation language and includes:

a first instrumentation language statement in the non-HDL instrumentation language that defines a default clock qualifier specifying at least one latch clock applicable to one or more second instrumentation language statements; and the one or more second instrumentation language statements describing said sequential instrumentation logic to which said default clock qualifier applies, wherein the one or more second instrumentation language statements describe the sequential instrumentation logic without reference to the at least one latch clock.

12. The program product of claim 11, wherein the collection of files includes at least one non-HDL file containing at least the first instrumentation language statement.

13. The program product of claim 11, wherein said collection of files declares at least a portion of said sequential logic by referencing a predefined helper function of said non-HDL instrumentation language.

14. The program product of claim 13, wherein:

said sequential logic includes a instrumentation flag circuit instantiated by the predefined helper function; and said storage element comprises a latch for holding a state of a flag.

\* \* \* \* \*